(12) United States Patent
Osako et al.

(10) Patent No.: US 7,262,511 B2
(45) Date of Patent: Aug. 28, 2007

(54) CONDUCTIVE ADHESIVE AGENT WITH ULTRAFINE PARTICLES

(75) Inventors: Katsuhisa Osako, Ibaraki (JP); Naoto Shioi, Ibaraki (JP); Daisuke Itoh, Ibaraki (JP); Hideyuki Gotoh, Ibaraki (JP); Yorishige Matsuba, Ibaraki (JP); Kazuki Tateyama, Kanagawa (JP); Yasunari Ukita, Kanagawa (JP); Masao Segawa, Kanagawa (JP); Takuo Kikuchi, Kanagawa (JP)

(73) Assignees: Harima Chemicals, Inc., Kakogawa-shi (JP); Toshiba Corporation, Tokyo (JP)

( * ) Notice: Subject to any disclaimer, the term of this patent is extended or adjusted under 35 U.S.C. 154(b) by 203 days.

(21) Appl. No.: 11/206,223

(22) Filed: Aug. 18, 2005

(65) Prior Publication Data

US 2006/0038304 A1 Feb. 23, 2006

(30) Foreign Application Priority Data

Aug. 18, 2004 (JP) .............................. 2004-238662

(51) Int. Cl.
*H01L 23/48* (2006.01)
*H01L 21/00* (2006.01)
*H01B 1/02* (2006.01)

(52) U.S. Cl. ...................... 257/783; 438/119; 252/512; 252/519.3

(58) Field of Classification Search ...................... None
See application file for complete search history.

(56) References Cited

U.S. PATENT DOCUMENTS 7,081,214 B2 * 7/2006 Matsuba et al. ............ 252/512

FOREIGN PATENT DOCUMENTS

| EP | 1339073 A1 * | 8/2003 |
| JP | 10312712 A * | 11/1998 |
| WO | WO 02/35554 A1 | 5/2002 |

* cited by examiner

*Primary Examiner*—Alonzo Chambliss
(74) *Attorney, Agent, or Firm*—Oblon, Spivak, McClelland, Maier & Neustadt, P.C.

(57) ABSTRACT

The present invention provides a conductive adhesive agent capable of being diluted with a solvent to give good coating workability and allowing formation of a conductive joint excellent in both thermal conductivity and electrical conductivity by inhibiting a gas generated when a binder resin is heat-cured after attachment of a part. The conductive adhesive agent according to the present invention is a conductive adhesive agent wherein, based on 100 parts by weight of silver powder having an average particle diameter of micrometers, which is used for a conductive medium, e.g. as a main component, 1 to 10 parts by weight of silver fine particles having an average particle diameter of nanometers is used in combination therewith and 5 to 15 parts by weight of thermosetting resin as a binder resin component and 10 parts or less by weight of solvent for adjustment of a fluid viscosity are blended therein as essential components, and by selection of such a blending ratio, generation of a gas component during heating and curing of the thermosetting resin to prevent formation of voids, and at the same time, fabrication of a conductive joint excellent in thermal conductivity and electrical conductivity is achieved.

10 Claims, 1 Drawing Sheet

CONDUCTIVE ADHESIVE AGENT WITH ULTRAFINE PARTICLES

FIELD OF THE INVENTION

The present invention relates to a conductive adhesive agent comprising, as major constituent parts, a metal component as a conductive medium and a thermosetting resin as an adhesive component, and a process for manufacturing an article comprising an assembly step including a conductive jointing operation using the conductive adhesive agent. Particularly, the present invention relates to a conductive adhesive agent capable of being used suitably for conductive jointing in mounting of a semiconductor chip part on a lead frame, and the like, and a process for manufacturing a semiconductor device using the conductive adhesive agent in a step of mounting the semiconductor chip part on the lead frame.

BACKGROUND ART

A soldering method is widely used as so called a conductive jointing method of establishing electrical and physical connection between two conductive members. For example, when a semiconductor chip part is mounted on a lead frame to manufacture a semiconductor device, solder jointing has been widely used for conductive jointing of a rear-surface electrode layer provided on the rear-surface of a semiconductor chip and a pad portion on the surface of the lead frame. Specifically, a tin alloy solder material, particularly a tin-lead alloy solder material, is a low temperature melting alloy, and has been widely used as a conductive joint member in die-mounting of a semiconductor chip. For example, in a semiconductor device in which the surface density of a current passing through the surface of a rear-surface electrode that is conductively jointed is high, such as a semiconductor laser, the resistance of a conductive joint portion itself is a main component of a series resistance, and the conductive joint member itself is required to have a low volume specific resistivity. On the other hand, in a semiconductor device having a configuration in which a region of operation for the device is formed on the surface of the semiconductor chip, and a predetermined bias is applied to the rear-surface electrode itself for keeping constant the potential of a semiconductor substrate used therein, e.g. the rear-surface electrode is grounded, but essentially no current passes through the surface of the rear-surface electrode, the magnitude of the volume specific resistivity of the conductive joint member itself is not considered particularly important. However, it is required to lower a heat resistance in the conductive joint portion in the process of diffusing heat to the lead frame by the route passing away the semiconductor substrate, the rear-surface electrode provided on the rear-surface thereof, and the conductive joint portion in order to dissipate heat generated in the device operation region provided on the surface of the semiconductor chip and thus to prevent a rise in operation temperature of the device itself.

When conductive jointing using tin-lead alloy solder is employed in a step of die-mounting this type of semiconductor chip, the heating temperature for solder melting ranges within 250° C. to 300° C. or the like, and a thermal effect on the device operation region provided on the surface of the semiconductor chip by such a heating temperature is quite limited. In a process for manufacturing the semiconductor device, a step requiring heating of the entire lead frame having the semiconductor chip mounted thereon, such as a wire bonding step, is carried out after the die-mounting step, but for avoiding damage originating from the above-mentioned heat history to such a conductive joint portion comprised of a tin-lead alloy soldered layer, a solder material having a high ratio of lead, the melting temperature of which is 250° C. or higher, is put to good use for tin-lead alloy solder used therein.

For tin-lead alloy solder functionally suitable as a conductive joint member like this, contained lead itself exhibits high toxicity when it is converted into various kinds of lead compounds, for instance lead oxides, and therefore avoiding use thereof is an essential problem to be solved in future. Currently, instead of tin-lead alloy solder, tin alloy solder containing no lead, so called lead free solder is being developed and progressively used. Most of lead free solder that is currently developed is low temperature melting type of lead free solder comprising tin as a main component, and unfortunately lead free solder having a melting temperature set to be within the range of 250° C. to 300° C., which is fit for the above-mentioned die-mounting of the semiconductor chip, is still under development in the present stage.

In addition to the conductive jointing method using tin-based alloy solder, a conductive jointing method using a conductive paste type of conductive adhesive agent is also used for a device for which the series resistance originating from the conductive joint portion forming an electrical connection to the rear-surface electrode of the semiconductor chip, and the heat resistance are not necessarily required to be low. The conductive paste type of conductive adhesive agent is paste where, as a metal filler (metallic filling material), a metal powder that is used for a conductive medium is uniformly dispersed in a thermosetting resin component, and the resin component is thermally cured by a cure treatment, and the cured resin is used as a binder resin to establish close physical contact between the metal fillers. This layer of cured product constitutes a conductive layer as a whole by close physical contact between metal fillers contained therein, and an electrical channel at an interface between the metal surface to be jointed and the layer of cured product is formed also due to physical contact between the metal filler being densely present on the surface of the layer of cured product and the metal surface to be jointed. By taking advantage of an adhesive property of the binder resin forming the layer of cured product, bonding and fixation of the layer of cured product to the metal surface to be jointed is achieved, and a current flow channel through physical contact between the metal filler and the metal surface to be jointed is maintained. The current flow channel constructed by a closely formed network of mutually contacting metal fillers also functions as a channel of heat flow, and resultantly the layer of cured product itself exhibits a considerably good thermal conductivity.

A proposal has been made for improving the electrical conductivity and thermal conductivity performance of the resultant layer of cured product itself compared with that made of a conventional conductive metal paste using a metal filler having an average particle diameter of about several micrometers as a conductive medium. A hybrid type conductive metal paste exhibiting a markedly improved electrical conductivity property has been developed by, for example, blending a small amount of ultrafine metal particles having an average particle diameter of 100 nm or less, in particular 20 nm or less, in addition to the metal powder having an average particle diameter of about several micrometers, as the conductive medium used in the conductive metal paste, whereby regions filled with ultrafine metal particles in narrow gaps between adjacent metal powders are provided, in addition to the closely formed network of mutually contacting metal powders, and sintering ultrafine metal particles in the filled regions at a low temperature when carrying out a heating treatment (see International Publication No. 02/035554 Pamphlet). This hybrid type conductive metal paste has been developed for the purpose of producing a fine wiring pattern using mainly the conductive metal paste, but the structure, in which narrow gaps between adjacent metal powders are filled with a low-temperature sintered body made of ultrafine metal particles to impart an excellent electrical conductivity property to the layer of cured product itself, also gives an excellent thermal conductivity property thereto.

SUMMARY OF THE INVENTION

A conductive paste type of conductive adhesive agent uses a thermosetting resin, the thermosetting temperature of which is generally 250° C. or less, and thus the treatment for curing thereof can usually be performed sufficiently even at a heating temperature of about 200° C. From this advantage, wide use of the conductive paste type of conductive adhesive agent is examined for the case when conductive jointing is to be achieved at a temperature equivalent to a heating treatment temperature used for conductive jointing by tin-lead alloy solder in a step of die-mounting a semiconductor chip. The composition of the conductive paste type of conductive adhesive agent is such that an amount of thermosetting resin components suitable for filling gap spaces between metal filler components is blended so that metal filler components such as a metal powder functioning as a conductive medium in its layer of cured product is fixed to form a current flow channel network where metal filler components mutually closely contact, by taking advantage of the bonding performance of a binder resin composed of a thermosetting resin. It is necessary to properly adjust a fluid viscosity for coating and filling the adhesive agent over the entire jointed surface in the step of die-mounting the semiconductor chip, and a solvent for adjusting viscosity is usually added thereto. The conductive paste type of conductive adhesive agent with the solvent added thereto is coated on, for example, a pad portion on the surface of a lead frame in an appropriate amount, and then, when the semiconductor chip is die-mounted therewith, it is brought into contact with the entire surface of a rear-surface electrode layer provided on the rear-surface of the semiconductor chip and spread coincidently to obtain a uniform thickness of a coating solution layer. After that, a cure treatment is carried out, i.e. the blended solvent is volatilized to remove, and then the thermosetting resin components are thermally cured to achieve bonding to the jointed surface with the binder resin and formation of the layer of cured product itself.

If the size, especially the chip area of the semiconductor chip that is die-mounted is small, volatilization and removal of the solvent contained therein proceeds quickly, but as the chip area is larger, longer time is required for the process in which the solvent seeks from a coated layer of conductive paste type of conductive adhesive agent that is located at the center of the semiconductor chip, through gaps between its thin layer thickness, to the outer periphery of the coated layer, and finally is volatilized away. Thus, if a solvent poor in volatility is used, a slight amount of solvent remains in the coated layer located at the center of the semiconductor chip, and thereafter when thermosetting resin components are thermally cured, a slight amount of remaining solvent is collected on the upper part of the cured layer with solid-liquid separation. Finally, when a slight amount of remaining solvent, which is accumulated at the interface between the upper surface of the cured product layer and the rear-surface electrode layer of the semiconductor chip, particularly at the central region thereof, is vaporized, a phenomenon can be observed in which voids are formed therefrom. In a void region formed at the interface between the upper surface of the cured product layer and the rear-surface electrode layer of the semiconductor chip, direct contact between the cured product layer and the rear-surface electrode layer cannot be achieved. Therefore, contact between the rear-surface electrode layer and the metal filler, which is required to form a current flow channel and a channel of heat flow, can not be achieved in this void region, and in other words, the electrical resistance and the heat resistance of a conductive joint that is formed can be caused to increase.

The present inventors have found that, if a heating treatment intended for a heat-curing reaction for the thermosetting resin blended as a binder resin component is carried out, for example, several secondary reaction products are produced due to secondary reactions occurring under the heating, in addition to the solvent remaining in a slight amount. The inventors have found that if among these secondary reaction products, "gaseous or volatile secondary reaction products" that are gasified and dissipated are contained in a considerable ratio, the "gaseous or volatile secondary reaction products" are caused to accumulate on the interface of the joint area, and again formation of voids is caused. That is, it has been found that it is also a new problem to be solved to inhibit formation of voids originating from "intrinsic" "gaseous or volatile secondary reaction products" resulting from secondary reactions occurring under heating with a heating treatment intended for a heat-curing reaction for the thermosetting resin blended as the binder resin component even if no solvent remains.

The present invention solves the problems, and an object of the present invention is to provide a new conductive paste type of conductive adhesive agent allowing conductive jointing to be performed with high work efficiency and reproducibility at a heating treatment temperature equivalent to that for conventional conductive jointing using tin-lead solder, and allowing a uniform and good thermal conductivity property to be achieved over an entire conductive joint portion even when the obtained conductive joint portion has a large conductive joint area relative to the thickness of its conductive joint layer. In addition, a further object of the present invention is to provide a process for manufacturing an article performing conductive jointing using such a new conductive paste type of conductive adhesive agent.

As a result of conducting vigorous studies for solving the above problems, the inventors have obtained the following findings. First, it has been found that in a hybrid type conductive metal paste disclosed in International Publication No. 02/035554 Pamphlet, a cured product layer exhibiting a markedly improved electrical conductivity property and having an excellent thermal conductivity is suitably fabricated by blending a small amount of ultrafine metal particles having an average particle diameter of 100 nm or less, for example 20 nm or less, in addition to the metal powder having an average particle diameter of about several micrometers, as the conductive medium used in the conductive metal paste, providing regions filled with ultrafine metal particles in narrow gaps between adjacent metal powders, in addition to the closely formed network of mutually contacting metal powders, and sintering ultrafine metal particles in the filled regions at a low temperature when carrying out a heating treatment. It has been found that this advantage is fit for an intended conductive metal paste type of conductive adhesive agent, and remaining problems are focused on how formation of voids at the interface between the upper surface of the obtained cured product layer and the rear-surface electrode layer of the semiconductor chip is avoided when the adhesive agent is applied to, for example, a step of die-mounting the semiconductor chip. As a result of continuously conducting studies, it has been found that if in the above-mentioned hybrid type conductive metal paste, ultrafine particles having a covering layer of an organic compound on the metal surface of ultrafine metal particles having an average particle diameter selected to be in the range of 1 to 20 nm are used in a fixed ratio in conjunction with a metal powder having an average particle diameter selected to be in the range of 0.5 to 30 μm, while the ratio of a thermosetting resin blended and the ratio of a solvent added for adjustment of a fluid viscosity are selected in a fixed range, persistence of the solvent can be avoided when a cure treatment is carried out to form a cured product layer for forming a conductive joint, and at the same time, the total amount of "intrinsic" "gaseous or volatile secondary reaction products" resulting from secondary reactions occurring under heating with a heating treatment intended for a heat-curing reaction for the thermosetting resin blended as the binder resin component can be reduced. In fact, it was found that when the conductive metal paste type of conductive adhesive agent formulated into the specific composition was used, formation of voids at the interface between the upper surface of the obtained cured product layer and the rear-surface electrode layer of the semiconductor chip could be actually avoided, and resultantly the thermal conductivity property of the obtained conductive joint portion was slightly poorer than, for example, the thermal conductivity in conventional conductive jointing using a tin-lead solder material when converted into an apparent thermal conductivity, but the level of the thermal conductivity property of the conductive joint portion required in a semiconductor device as a final object was exceeded with a sufficient margin. The inventors have completed the present invention described below based on a series of findings including the verifications.

That is, a conductive adhesive agent of a first embodiment according to the present invention is a conductive adhesive agent comprising, as major constituent parts, a metal component as a conductive medium and a thermosetting resin as an adhesive component, wherein the conductive adhesive agent contains, as essential components thereof:

a metal powder (A) made of at least one metal material selected from the group consisting of silver, copper, gold, platinum, nickel, zinc, bismuth and tungsten, and having an average particle size selected to be in the range of 0.5 to 30 μm;

ultrafine particles (B) that are composed of ultrafine metal particles with an average particle size selected to be in the range of 1 to 20 nm made of at least one metal material selected from the group consisting of silver, copper, gold, platinum, nickel, zinc and bismuth, and a covering layer of an organic compound being formed on the metal surface thereof;

a thermosetting resin (C); and a solvent (D), and the ratio of blended amounts of said essential components in the conductive adhesive agent is such that provided that the blended amount A of said metal powder is 100 parts by weight, the blended amount B of said ultrafine particles is selected to be in the range of 1 to 10 parts by weight, the blended amount C of said thermosetting resin is selected to be in the range of 5 to 15 parts by weight, and the blended amount D of said solvent is selected to be 10 parts or less by weight.

Particularly, the conductive adhesive agent is the conductive adhesive agent having said composition blended therein, wherein when the conductive adhesive agent of which the amount W is 100 parts by weight is subjected to a heating treatment at a temperature set to be within the range of 150° C. to 300° C. under the atmosphere of an inert gas to volatilize said solvent and cure said thermosetting resin, the amount of reduction in total weight resulting from components dissipated into a vapor phase with said heating treatment is defined as E, the amount of said solvent to be volatilized, which is contained in the conductive adhesive agent of said amount W, is defined as $D_1$, the amount of said metal powder contained in the conductive adhesive agent of said amount W is defined as $A_1$, the amount of said ultrafine particles contained in the conductive adhesive agent of said amount W is defined as $B_1$, and the amount of said thermosetting resin contained in the conductive adhesive agent of said amount W is defined as $C_1$, and the amount a of reduction in weight exclusive of the amount $D_1$ of said solvent volatilized, in the amount E of reduction in total weight resulting from components dissipated into the vapor phase, is defined as equation 1: $\alpha \equiv E - D_1$, and a ratio of weight loss F(%) resulting from gas generation other than volatization of said solvent is defined as equation 2: $F \equiv \{\alpha/(A_1 + B_1 + C_1)\} \times 100$, the ratio of weight loss F(%) is kept within 3% by weight.

Further, a conductive adhesive agent of a second embodiment according to the present invention is a conductive adhesive agent comprising, as major constituent parts, a metal component as a conductive medium and a thermosetting resin as an adhesive component, wherein the conductive adhesive agent contains, as essential components thereof:

a metal powder (A) made of at least one metal material selected from the group consisting of silver, copper, gold, platinum, nickel, zinc, bismuth and tungsten, and having an average particle size selected to be in the range of 0.5 to 30 μm;

ultrafine particles (B) that are composed of ultrafine metal particles with an average particle size selected to be in the range of 1 to 20 nm made of at least one metal material selected from the group consisting of silver, copper, gold, platinum, nickel, zinc and bismuth, and a covering layer of an organic compound being formed on the metal surface thereof;

a thermosetting resin (C); and a solvent (D), and the ratio of blended amounts of said essential components in the conductive adhesive agent is such that the blended amount A of the metal powder is selected to be in the range of 74.0 parts by weight to 94.3 parts by weight, the blended amount B of said ultrafine particles is selected to be in the range of 0.9 parts by weight to 8.7 parts by weight, the blended amount C of said thermosetting resin is selected to be in the range of 4.0 parts by weight to 12.9 parts by weight, and the blended amount D of said solvent is selected to be within 8.6 parts by weight.

Particularly, the conductive adhesive agent is the conductive adhesive agent having said composition blended therein, wherein when the conductive adhesive agent of which the amount W is 100 parts by weight is subjected to a heating treatment at a temperature set to be within the range of 150° C. to 300° C. under the atmosphere of an inert gas to volatilize said solvent and cure said thermosetting resin, the amount of reduction in total weight resulting from components dissipated into a vapor phase with said heating treatment is defined as E, the amount of said solvent to be volatilized, which is contained in the conductive adhesive agent of said amount W, is defined as $D_1$, the amount of said metal powder contained in the conductive adhesive agent of said amount W is defined as $A_1$, the amount of said ultrafine particles contained in the conductive adhesive agent of said amount W is defined as $B_1$, and the amount of said thermosetting resin contained in the conductive adhesive agent of said amount W is defined as $C_1$, and the amount a of reduction in weight exclusive of the amount $D_1$ of said solvent volatilized, in the amount E of reduction in total weight resulting from components dissipated into the vapor phase, is defined as equation 1: $\alpha \equiv E - D_1$, and a ratio of weight loss F(%) resulting from gas generation other than volatization of said solvent is defined as equation 2: $F \equiv \{\alpha/(A_1+B_1+C_1)\} \times 100$, the ratio of weight loss F(%) is kept within 3% by weight.

At this time, in the conductive adhesive agent according to the present invention, it is preferred that a mixture of a spherical metal powder (A-1) and a flaky metal powder (A-2) is used as said metal powder (A), and the mixing ratio of the spherical metal powder (A-1) to the flaky metal powder (A-2) is selected to be in the range of 99:1 to 50:50 as a weight ratio.

On the other hand, it is desired that the organic compound composing said covering layer present on the metal surface of the ultrafine metal particles for said ultrafine particles (B) is an organic compound that is capable of reacting with any of resin constituting components of said thermosetting resin (C) to be incorporated into part of said thermosetting resin.

Particularly, it is more preferable that said thermosetting resin (C) is a thermosetting resin composition comprising a coupling agent, in addition to an epoxy resin and its curing agent used as resin constituting components.

Furthermore, the solvent (D) is more preferably selected from organic solvents showing no reactivity to the epoxy resin, wherein the boiling point thereof in an atmosphere of 1013 hPa (1 atmospheric pressure) is at least 160° C. or higher and less than 260° C., desirably 180° C. or higher and less than 210° C.

In addition, the present invention provides an invention of a process for manufacturing an article using a conductive adhesive agent according to the present invention as an invention of use of the above conductive adhesive agent according to the present invention, and provides, for instance, an invention of a method of forming a conductive joint using the conductive adhesive agent according to the present invention, when an article comprising as components a first member and a second member coupled together at least by the conductive joint is manufactured.

That is, the process for manufacturing an article according to the present invention is a process for manufacturing an article comprising a conductive jointing body, and a first member and a second member bound together by the conductive jointing body, comprising the step of:

holding said first member and second member via the conductive adhesive agent having the above-mentioned constitutions according to the present invention, and heating said conductive adhesive agent to obtain said conductive jointing body therebetween, whereby the binding is attained.

In particular, a process for manufacturing a semiconductor device according to the present invention, which is just selection of an embodiment to be applied to manufacture of the semiconductor device, is a process for manufacturing a semiconductor device, comprising the steps of:

feeding the conductive adhesive agent having the above-mentioned constitutions according to the present invention onto a lead frame as a die-mounting agent;

mounting a semiconductor element on said die-mounting agent;

heat-curing said die-mounting agent to form a conductive joint thereby;

bonding between said semiconductor element and said lead frame by a metal wire; and sealing at least part of said lead frame, the die mounting agent, the semiconductor element and the metal wire.

For example, if the process is applied to a manufacture of a resin mold type semiconductor device, it is a process for manufacturing a resin mold type semiconductor device in which at least connection is established by a metal wire between a semiconductor element that is die-mounted on a lead frame by a conductive joint and the lead frame, and then resin molding is carried out, wherein the manufacture process uses a conductive adhesive agent as an agent for die-mounting by mean of conductive joint, and comprises the steps of:

supplying the conductive adhesive agent according to the present invention onto the lead frame as a die-mounting agent;

mounting the semiconductor element on the die-mounting agent;

heat-curing the die-mounting agent to form a conductive joint;

bonding between the semiconductor element and the lead frame by a metal wire; and sealing with resin at least part of the lead frame, the die-mounting agent, the semiconductor element and the metal wire.

When using the conductive adhesive agent according to the present invention, a solvent added for the purpose of adjustment of a fluid viscosity is volatilized beforehand, and then a heating treatment intended for a heat-curing reaction for a thermosetting resin blended as a binder resin component is carried out, the amount of "gaseous or volatile secondary reaction products" which are gasified and dissipated, among secondary reaction products produced by secondary reactions occurring under the heating, is small, formation of voids resulting from accumulation of the "gaseous or volatile secondary reaction products" onto the interface of the joint portion can be thus avoided, and the number of factors causing detachment is lessened. Particularly, formation of voids and detachment at the interface are prevented, the area of contact between the conductive joint layer and the joint object is maintained, and a joint portion excellent in thermal conductivity can be obtained. In addition, by ensuring that neither voids nor detachment at the interface occur in the conductive joint portion produced, for example, progressive expansion of detachment at the interface as a temperature cycle is applied is also inhibited, and therefore long-term reliability of the joint portion is improved.

NOTATION FOR SYMBOLS

Figure 1:
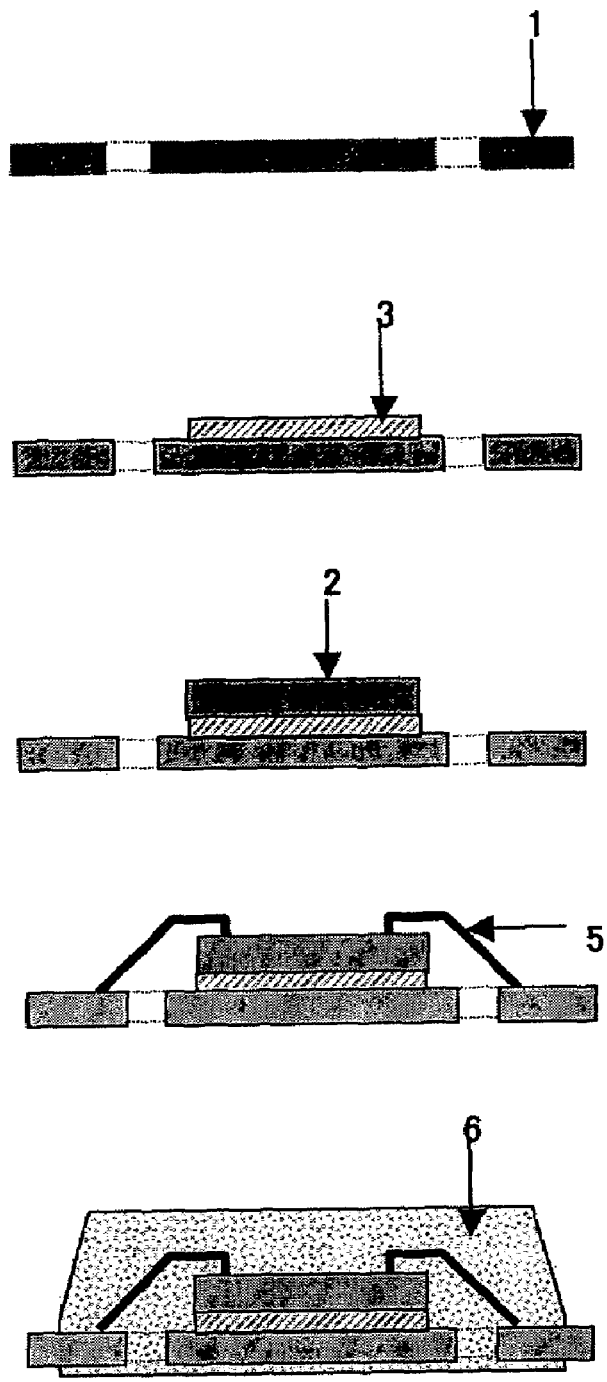
FIG. 1 is a view schematically illustrating a process for assembling a resin-mold type semiconductor device, and showing the steps of die-mounting a semiconductor chip on a lead frame, wire bonding between the semiconductor chip and the lead frame, and resin molding.

1: lead frame
2: semiconductor chip
3: layer of conductive adhesive agent for die-mounting
5: bonding wire
6: resin for mold-sealing

DETAILED DESCRIPTION OF THE PREFERRED EMBODIMENTS

As described above, it was noted that a hybrid type conductive metal paste disclosed in International Publication No. 2/035554 Pamphlet had been developed for the purpose of fabricating fine wiring patterns using mainly the conductive metal paste, but a structure in which narrow gaps between adjacent metal powders are filled with a low-temperature sintered body of ultrafine metal particles imparting an excellent electrical conductivity property to a cured product layer itself fabricated from the metal paste gave an excellent thermal conductivity property at the same time, and further improvements were made, specifically the composition was optimized so as to be compatible to uses for the conductive adhesive agent, resulting in completion of the conductive adhesive according to the present invention. Thus, the conductive adhesive agent has a basic constitution characterizing the hybrid type conductive metal paste disclosed in international Publication No. 02/035554 Pamphlet, and its composition is selected to have a blending ratio compatible to a new object to avoid formation of voids at an interface between the upper surface of the obtained cured product layer and a rear-surface electrode layer of a semiconductor chip particularly when the conductive adhesive agent is applied to a step of die-mounting the semiconductor chip.

The conductive adhesive agent according to the present invention will be further explained in detail below.

First, the constitution of the conductive adhesive agent according to the present invention can be described as two types of embodiments mutually having substantially equivalent technical conceptions and described below.

The conductive adhesive agent according to the first embodiment of the present invention, of these two types of embodiments, is a conductive adhesive agent comprising, as major constituent parts, a metal component as a conductive medium and a thermosetting resin as an adhesive component, wherein the conductive adhesive agent contains, as essential components thereof:

a metal powder (A) made of at least one metal material selected from the group consisting of silver, copper, gold, platinum, nickel, zinc, bismuth and tungsten, and having an average particle size selected to be in the range of 0.5 to 30 µm;

ultrafine particles (B) that are composed of ultrafine metal particles with an average particle size selected to be in the range of 1 to 20 nm made of at least one metal material selected from the group consisting of silver, copper, gold, platinum, nickel, zinc and bismuth, and a covering layer of an organic compound being formed on the metal surface thereof;

a thermosetting resin (C); and a solvent (D), and the ratio of blended amounts of said essential components in the conductive adhesive agent is such that provided that the blended amount A of said metal powder is 100 parts by weight, the blended amount B of said ultrafine particles is selected to be in the range of 1 to 10 parts by weight, the blended amount C of said thermosetting resin is selected to be in the range of 5 to 15 parts by weight, and the blended amount D of said solvent is selected to be 10 parts or less by weight.

Particularly, the conductive adhesive agent is the conductive adhesive agent having said composition blended therein, wherein when the conductive adhesive agent of which the amount W is 100 parts by weight is subjected to a heating treatment at a temperature set to be within the range of 150° C. to 300° C. under the atmosphere of an inert gas to volatilize said solvent and cure said thermosetting resin, the amount of reduction in total weight resulting from components dissipated into a vapor phase with said heating treatment is defined as E, the amount of said solvent to be volatilized, which is contained in the conductive adhesive agent of said amount W, is defined as $D_1$, the amount of said metal powder contained in the conductive adhesive agent of said amount W is defined as $A_1$, the amount of said ultrafine particles contained in the conductive adhesive agent of said amount W is defined as $B_1$, and the amount of said thermosetting resin contained in the conductive adhesive agent of said amount W is defined as $C_1$, and the amount a of reduction in weight exclusive of the amount $D_1$ of said solvent volatilized, in the amount E of reduction in total weight resulting from components dissipated into the vapor phase, is defined as equation 1: $\alpha = E - D_1$, and a ratio of weight loss F(%) resulting from gas generation other than volatization of said solvent is defined as equation 2: $F = \{\alpha/(A_1 + B_1 + C_1)\} \times 100$, the ratio of weight loss F(%) is kept within 3% by weight.

On the other hand, the conductive adhesive agent according to the second embodiment of the present invention describing a technical conception substantially equivalent to that of the conductive adhesive agent according to the first embodiment of the present invention is a conductive adhesive agent comprising, as major constituent parts, a metal component as a conductive medium and a thermosetting resin as an adhesive component, wherein the conductive adhesive agent contains, as essential components thereof:

a metal powder (A) made of at least one metal material selected from the group consisting of silver, copper, gold, platinum, nickel, zinc, bismuth and tungsten, and having an average particle size selected to be in the range of 0.5 to 30 μm;

ultrafine particles (B) that are composed of ultrafine metal particles with an average particle size selected to be in the range of 1 to 20 nm made of at least one metal material selected from the group consisting of silver, copper, gold, platinum, nickel, zinc and bismuth, and a covering layer of an organic compound being formed on the metal surface thereof;

a thermosetting resin (C); and a solvent (D), and the ratio of blended amounts of said essential components in the conductive adhesive agent is such that the blended amount A of the metal powder is selected to be in the range of 74.0 parts by weight to 94.3 parts by weight, the blended amount B of said ultrafine particles is selected to be in the range of 0.9 parts by weight to 8.7 parts by weight, the blended amount C of said thermosetting resin is selected to be in the range of 4.0 parts by weight to 12.9 parts by weight, and the blended amount D of said solvent is selected to be within 8.6 parts by weight.

Particularly, the conductive adhesive agent is the conductive adhesive agent having said composition blended therein, wherein when the conductive adhesive agent of which the amount W is 100 parts by weight is subjected to a heating treatment at a temperature set to be within the range of 150° C. to 300° C. under the atmosphere of an inert gas to volatilize said solvent and cure said thermosetting resin, the amount of reduction in total weight resulting from components dissipated into a vapor phase with said heating treatment is defined as E, the amount of said solvent to be volatilized, which is contained in the conductive adhesive agent of said amount W, is defined as $D_1$, the amount of said metal powder contained in the conductive adhesive agent of said amount W is defined as $A_1$, the amount of said ultrafine particles contained in the conductive adhesive agent of said amount W is defined as $B_1$, and the amount of said thermosetting resin contained in the conductive adhesive agent of said amount W is defined as $C_1$, and the amount α of reduction in weight exclusive of the amount $D_1$ of said solvent volatilized, in the amount E of reduction in total weight resulting from components dissipated into the vapor phase, is defined as equation 1: $\alpha \equiv E - D_1$, and a ratio of weight loss F(%) resulting from gas generation other than volatilization of said solvent is defined as equation 2: $F \equiv \{\alpha/(A_1+B_1+C_1)\} \times 100$, the ratio of weight loss F(%) is kept within 3% by weight.

Hence, the conductive adhesive agent according to the first embodiment of the present invention and the conductive adhesive agent according to the second embodiment of the present invention both use a small amount of ultrafine particles (B) having a covering layer of an organic compound on the metal surface of ultrafine metal particles having an average particle diameter selected to be in the range of 1 to 20 nm in combination with the metal powder (A) having an average particle diameter selected to be in the range of 0.5 to 30 μm, which is a major component, as for metal components blended as a conductive medium. When the cured product is formed, the metal powder having an average particle diameter of about several micrometers, which is contained in a coating solution layer of said conductive adhesive agent, is first deposited, and metal powders are mutually stacked to construct a stacked structure as a base of a current flow channel network. In the stacked structure used as a base of the current flow channel, a contact area of a site itself where the metal powders contact with each other is not large, and narrow gaps exist around the site, but as the solvent is volatilized away, the ultrafine metal particles having an average particle diameter of 1 to 20 nm are packed so as to fill up the narrow gaps, and resultantly a region filled with ultrafine metal particles is formed. When a heating treatment is carried out to remove the covering layer of an organic compound covering the ultrafine metal particles, the ultrafine metal particles having an average particle diameter selected to be in the range of 1 to 20 nm touch together with direct contact of their metal surfaces, and cause a low-temperature sintering phenomenon specific to metal nanoparticles to proceed. In the region filled with ultrafine metal particles where the narrow gaps are filled up, a sintered body of ultrafine metal particles generated is in close contact with the surface of the metal powder as well. Resultantly, contribution of contact via the sintered body of ultrafine metal particles, with which the narrow gaps between metal powders are filled, is added to the contact area of the site itself where metal powders mutually contact, and thus the effective contact area of the site where metal powders mutually contact remarkably increases as for the network of current flow channel being constructed with said stacked structure. The current flow channel formed in the cured product layer, its total resistance value consists of a resistance originating from individual metal powders themselves and a contact resistance at the site where metal powders mutually contact, but if a metal powder having an average particle diameter of about several micrometers is used, the proportion of the contact resistance is predominant. In the cured product layer fabricated with the conductive adhesive agent according to the present invention, the contact resistance is considerably reduced as the effective contact area of the site where metal powders mutually contact increases, and resultantly, a considerable reduction in apparent volume specific resistivity is achieved. For the thermal conductivity of the cured product layer itself, the thermal conductivity of the binder resin itself is by far small compared with that of the metal material, the heat flow channel network formed by the metal powders being mutually stacked serves as a principal heat conduction channel. Thus, for the heat resistance, in the cured product layer fabricated with the conductive adhesive agent according to the present invention, the contact resistance is considerably reduced as the effective contact area of the site where the metal powders mutually contact increases, and resultantly a considerable improvement in apparent heat resistivity is achieved.

The cured product layer fabricated with the conductive adhesive agent according to the present invention is usually formed such that the surfaces of two conductive members to be jointed together, e.g. metal surfaces are placed on the upper and lower sides, respectively, and the cured product layer is inserted therebetween because such a conductive adhesive agent itself shows flowability. Thus, the fabricated cured product layer is in close contact with the metal surface placed on the lower side as a matter of course, and particularly narrow gaps exist around the site where the metal powder contained in the conductive adhesive agent according to the present invention and the metal surface are in contact with each other. A region filled with ultrafine metal particles where such narrow gaps are filled is formed in the site of contact between the lower metal surface and the metal powder, and the sintered body of ultrafine metal particles generated subsequently is in close contact with both the metal powder and lower metal surface.

When metal powders are mutually stacked to form the stacked structure as a base of the current flow channel network, the content of binder resin components in the conductive adhesive agent according to the present invention is properly selected so that contact between the metal powder located on the upper surface of the stacked structure and the metal surface placed on the upper side can be achieved. That is, when the solvent is volatilized, gap spaces present in the stacked structure as a base of the current flow channel network formed by metal powders being mutually stacked are filled with ultrafine metal particles and thermosetting resin components, but if the content of thermosetting resin components is unnecessarily high, a layer composed substantially of only thermosetting resin components is formed on the upper surface by thermosetting resin components overflowing from the gap spaces. In the conductive adhesive agent according to the present invention, the content of thermosetting resin components, as well as the content of ultrafine metal particles, is selected to be in the range of not being excessive with respect to the total amount of metal powder blended, whereby formation of a layer composed substantially of only thermosetting resin components on the upper surface is avoided. As a result, the current flow channel formed by metal powders being mutually stacked, which is formed in the cured product layer fabricated with the conductive adhesive agent according to the present invention and the metal surface placed on the upper side can be in close contact with each other. At the same time, when the solvent is volatilized, narrow gaps are formed around the site of contact between the metal powder located on the upper surface of the stacked structure and the metal surface placed on the upper side, a region filled with ultrafine metal particles where such narrow gaps are filled is formed, and the sintered body of ultrafine metal particles generated thereafter is in contact with both the metal powder and metal surface on the upper side.

For achieving closer contacts between metal powders in the stacked structure formed by metal powders being mutually stacked, a mixture of a spherical metal powder (A-1) and a flaky metal powder is preferably used as a metal powder used. Specifically, if a small amount of flaky metal powder is used in conjunction with the spherical metal powder, the flaky metal powder is placed in a wedged form in a stacked structure composed of the spherical metal powder, resulting in an increase in density at a point of contact between metal powders. At this time, the mixing ratio of the spherical metal powder (A-1) to the flaky metal powder (A-2) is more preferably selected to be in the range of 99:1 to 50:50 as a weight ratio. For example, the average particle diameter of the spherical metal powder (A-1) is equivalent to that of flaky metal powder (A-2), the ratio of the spherical metal powder (A-1) to the flaky metal powder (A-2) is more preferably selected to be in the range of 95:5 to 70:30.

For example, in the stacked structure formed by metal powder being mutually stacked, if spherical powders having the same particle diameter achieve a closest packing state, the ratio of the occupied volume of their gap spaces to the metal powders is about 25:75, and if spherical metal powders having the same particle diameter are deposited in a cubic lattice form, the ratio of the occupied volume of their gap spaces to the metal powders is about 50:50. Generally, in a stacked structure formed such that metal powders having various particle shapes and particle distributions are mutually stacked, the ratio of the occupied volume of their gap spaces to the metal powders is in the range of 15:85 to 66:34. In the conductive adhesive agent according to the present invention, these gap spaces are filled with ultrafine metal particles and thermosetting resin components, and at this time, the content of ultrafine metal particles is selected to be an amount suitable for occupation of narrow gaps in the site where metal powders mutually contact, and the like. That is, the blended amount of ultrafine particles (B), as a secondary component, having a covering layer of an organic compound on the metal surface of ultrafine metal particles having an average particle diameter selected to be in the range of 1 to 20 nm is at least 1 part by weight or greater based on 100 parts by weight of metal powder (A), as a main component, having an average particle diameter selected to be in the range of 0.5 to 30 μm. If the blending ratio of the ultrafine particles to the metal powder is unnecessarily high, the ratio of the binder resin relatively decreases, resulting in an insufficient binding capability of the binder resin maintaining the mechanical strength of the entire cured product layer formed, and therefore the upper limit of the blended amount of ultrafine particles is in the range of not exceeding 10 parts by weight based on 100 parts by weight of metal powder. More preferably, the blended amount of ultrafine particles is selected to be in the range of 1 part by weight to 6 parts by weight based on the 100 parts by weight of metal powder.

For the purpose of maintaining contact between metal powders and the mechanical strength of the entire cured product layer taking advantage of the bonding capability of the binder resin produced from the thermosetting resin (C), the blended amount of thermosetting resin is selected to be at least 5 parts by weight or greater based on 100 parts by weight of metal powder. In order to avoid an excessive content of binder resin exceeding the ratio of the gap spaces expected in the stacked structure formed by metal powders being mutually stacked, the upper limit of the blended amount of thermosetting resin should be in the range of not exceeding 15 parts by weight based on 100 parts by weight of metal powder. More preferably, the blended amount of thermosetting resin is selected to be 6 parts by weight to 10 parts by weight based on 100 parts by weight of metal powder.

In the conductive adhesive agent according to the present invention, the solvent (D) is added mainly for adjustment of its fluid viscosity. That is, the conductive adhesive agent according to the present invention has a role of achieving flowability required when the surfaces of two conductive members to be jointed, e.g. metal surfaces are placed on the upper and lower sides, and the conductive adhesive agent is inserted therebetween in a uniform liquid thickness. In the conductive adhesive agent according to the present invention, a liquid phase component consists of the thermosetting resin (C) and the solvent (D), and therefore the added amount of solvent (D) is selected so that the total volume of the thermosetting resin (C) and the solvent (D) is in the range of a fixed ratio to the total volume of the metal powder (A) and the ultrafine particles (B) as a solid component. In other words, the total blended amount of thermosetting resin (C) and solvent (D) is selected to be in the range of not exceeding 25 parts by weight at most, more preferably in the range of not exceeding 20 parts by weight, for example, about 15 parts by weight, based on 100 parts by weight of metal powder (A). Thus, in the conductive adhesive agent according to the present invention, the added amount of solvent (D) is selected to be in the range of not exceeding 10 parts by weight at most based on 100 parts by weight of metal powder (A). In the above described range, the added amount of solvent (D) is preferably adjusted so that the fluid viscosity of the conductive adhesive agent is preferably in the range of 10 Pa·s (25° C.) to 50 Pa·s (25° C.). In some cases, the fluid viscosity may be in a desired range even if the added amount of solvent (D) is 0. If considering operability in uniformly coating the conductive adhesive agent according to the present invention, it is generally preferable that a slight amount of solvent (D) is added. That is, the added amount of solvent (D) is preferably selected to be at least 0.1 parts by weight or greater based on 100 parts by weight of metal powder. For example, by selecting a dilution ratio such that the ratio of the blended amount of thermosetting resin (C) and solvent (D) is in the range of 10:1 to 10:7, good operability can be exhibited when coating is performed.

For the solvent (D), a solvent which is volatilized and removed when the conductive adhesive agent according to the present invention is subjected to a heating treatment to form a cured product layer is used. That is, for the solvent (D) itself, an organic solvent not exhibiting reactivity, in such a heating treatment, to components (e.g. epoxy resin and curing agent thereof) essential for formation of resin constituting the thermosetting resin (C), e.g. a thermosetting epoxy resin is suitably used. At the same time, when the heating treatment is carried out at a temperature selected to be in the range of 200° C. to 300° C., preferably a temperature of about 200° C. to 250° C. in formation of the cured product layer, the solvent (D) should be already volatilized and removed, and an organic solvent of which the boiling point in an atmosphere of 1 atmospheric pressure (1013 hPa) is less than 260° C., normally less than 210° C. is preferably used. In other words, for some added amount, if an organic solvent having a boiling point higher than the above described heat-curing treatment temperature by 10° C. or higher, e.g. a boiling point of 260° C. or higher (or 210° C. or higher) is used, there may be cased where a considerable amount of solvent remains until the thermosetting resin proceeds, and finally, after separation of the solid-liquid phase between a resin cured product and solvent components, vaporization of such a solvent proceeds to form voids. In a step of transpiring and removing the contained solvent (D) prior to the curing of the thermosetting epoxy resin, for example, preliminary heating is carried out at a temperature of about 100° C., but at this time, if the boiling point is lower than the preliminary heating temperature, very small air bubbles may be formed. For avoiding the formation of the very small air bubbles, an organic solvent of which the boiling point in an atmosphere of 1 atmospheric pressure (1013 hPa) is significantly higher than the preliminary heating temperature is preferably used, and generally, an organic solvent having a boiling point of at least 160° C. or higher, preferably 180° C. or higher is preferably used.

The ultrafine particles (B) blended in the conductive adhesive agent according to the present invention have a covering layer of an organic compound provided on the metal surface of ultrafine metal particles, and thus inhibit a situation in which coagulated clumps are formed as a result of contained ultrafine metal particles making their metal surfaces mutually contact when such a conductive adhesive agent is prepared and stored. For the organic compound forming a covering layer present on the metal surface of ultrafine metal particles in such ultrafine particles, an organic compound detachable from the metal surface at the stage of carrying out the heating treatment for fabricating a cured product is used. The ultrafine particles (B) maintain a state in which substantially no oxidized film is present on the surface of ultrafine metal particles as a result of providing the covering layer of the organic compound on the metal surface of the ultrafine metal particles. The covering layer of the organic compound provided on the metal surface of the ultrafine metal particles also has a capability as a dispersant uniformly dispersing the ultrafine particles (B) in a liquid phase component composed of the thermosetting resin (C) and the solvent (D).

For the organic compound forming the covering layer present on the metal surface of the ultrafine metal particles, a compound having a group containing a nitrogen, oxygen or sulfur atom as a group capable of coordinate bonding with a metal element contained in such ultrafine metal particles is used. For example, the metal surface is covered with one or more kinds of amine compounds having one or more end amino groups.

The compound that is used for closely covering the surface of ultrafine metal particles for the ultrafine particles (B) uses a group having a lone electron pair on the nitrogen, oxygen or sulfur atom when forming a coordinate bond with a metal element, and, for example, groups containing a nitrogen atom include an amino group. Groups containing a sulfur atom include sulfanyl group (—SH) and a sulfide type sulfadiyl group (-s-). Groups containing an oxygen atom include a hydroxy group and an ether type oxy group (—O—). When the solvent is volatilized, e.g. a temperature of about 100° C. is maintained, the covering layer of the organic compound should be retained, and when the thermosetting resin is cured by heating-up, e.g. it is heated at 200° C., the covering layer of the organic compound should be capable of being immediately detached from the surface of the ultrafine metal particles of the ultrafine particles. Thus, the organic compound used for the covering layer has a boiling point preferably in the range of 100° C. to 300° C., normally 250° C. or lower.

For example, when an amine compound is used, and it is, for example, an alkyl amine, its alkyl group has 4 to 20 carbon atoms, further preferably 8 to 18 carbon atoms, and has an amino group at the end of the alkyl chain. Generally, for formation of such a coordinate bond, a primary amine type exhibits a higher binding capacity and is thus preferable, but secondary amine type and tertiary amine type compounds can also be used. Compounds with adjacent two or more amino groups involved in binding, such as a 1,2-diamine type and a 1,3-diamine type can also be used. Polyoxyalkyleneamine can be suitably used.

Preferably, the amount of organic compound forming the covering layer allows at least one molecular layer to be formed on the metal surface of the ultrafine metal particles. If the average particle diameter of ultrafine metal particles used decreases, the total amount of organic compound forming the covering layer relatively increases on the basis of the mass of the ultrafine metal particles themselves. One or more kind of amine compound is contained as a total sum in an amount of preferably 0.2 to 6 parts by weight, more preferably 0.5 to 3 parts by weight per 10 parts by weight of ultrafine metal particles having an average particle diameter selected to be in the range of 1 to 20 nm.

It is more preferable that when the thermosetting resin is heat-cured, the organic compound forming the covering layer can be detached from the surface of the ultrafine metal particles and react with any of resin components contained the thermosetting resin. That is, it is preferable that after being detached from the surface of the ultrafine metal particles of the ultrafine particles, the organic compound reacts any of the resin constituting components present in the thermosetting resin, for example an epoxy resin and a curing agent thereof, and is used as one component of the thermosetting resin that is finally formed.

For the thermosetting resin, a thermosetting epoxy resin is usually used. Its suitable composition is a thermosetting resin composition containing a coupling agent in addition to the epoxy resin and the curing agent thereof, which are resin constituting components. The coupling agent is added in a small amount for the purpose of improving a bonding property between the metal surface to be jointed and the formed thermosetting resin. Coupling components such as a silane-coupling agent and a titanium-coupling agent, which are used for the purpose of improving adhesion to the metal surface, may be added in an appropriate amount depending on the joint object.

For the epoxy resin and the curing agent thereof which are resin constituting components of the thermosetting epoxy resin, various combinations can be selected as long as the obtained epoxy resin cured product satisfies a mechanical strength required as a binder resin. When the conductive adhesive agent according to the present invention is applied to the step of die-mounting a semiconductor chip in manufacture of a semiconductor device, a conductive joint composed of the obtained cured product layer needs to be free from a degradation in quality of the binder resin by heating in the subsequent wire bonding step. In this respect, use of an acid anhydride as a curing agent for the epoxy resin in suitable. The acid anhydride can react with the organic compound forming the covering layer present on the metal surface of the ultrafine metal particles in the ultrafine particles, for example the amino group of an amine compound, and is preferable in this respect. The acid anhydride is consumed by the reaction with the organic compound forming the covering layer, in addition to the curing of the epoxy resin, and therefore the blended amount of acid anhydride in the epoxy resin is preferably adjusted in consideration of a consumption by the reaction with the organic compound, in addition to a blending ratio suitable for the curing of the epoxy resin. For example, it is preferable that an acid anhydride originating from a dibasic acid is blended in an amount of 0.8 to 1.2 moles, based on 1 mole of epoxy group originating from an epoxy resin compound. In consideration of the fact that part of the acid anhydride originating from the dibasic acid is consumed with the reaction with the organic compound forming the covering layer present on the metal surface of the above-mentioned ultrafine metal particles, it is more preferable that for example, the acid anhydride originating from the dibasic acid is blended in an amount of 0.9 to 1.2 moles, based on 1 mole of epoxy group originating from the epoxy resin compound.

Organic acid anhydrides or acid anhydride derivatives which is capable of reacting with the organic compound forming the covering layer, e.g. an amine compound, in addition to serving as a curing agent for the epoxy resin, and can be suitably used may include aromatic acid anhydrides such as phthalic anhydride, trimellitic anhydride, pyromellitic anhydride, benzophenone tetracarboxylic anhydride, ethylene glycol bis (anhydrotrimellitate) and glycerol tris (anhydrotrimellitate), cyclic aliphatic acid anhydrides such as maleic anhydride, succinic anhydride, tetrahydrophthalic anhydride, methyltetrahydrophthalic anhydride, methylnadic anhydride, alkylsuccinic anhydride, alkenyl succinic anhydride, hexahydrophthalic anhydride, methylhexahydrophthalic anhydride and methylcyclohexenetetracarboxylic anhydride, and aliphatic acid anhydrides such as polyadipic anhydride, polyaceraic anhydride and polysebacic anhydride.

When the conductive adhesive agent according to the present invention is applied to the step of die-mounting a semiconductor chip in manufacture of a semiconductor device, the thickness of the cured product layer used as a conductive joint is selected to be in the range of 3% to 20%, more preferably 5% to 15% based on the thickness of a semiconductor substrate portion in a targeted semiconductor chip part. That is, there may be variations in the thickness of the semiconductor substrate portion, or very small irregularities may exist on the surface of the lead frame, and the thickness is set to be in the range of about 2 to 100 μm, or 10 to 100 μm in some cases depending on the size of the semiconductor chip part, as a thickness of the cured product layer capable of absorbing a range of variations caused by the irregularities on the surface to be jointed. With respect to the targeted thickness of the cured product layer, the average particle diameter of the metal powder (A) as a main component used in the conductive adhesive agent according to the present invention is selected to be an appropriate value within the range of 0.5 to 30 μm. Specifically, it is preferable that the average particle diameter of the metal powder used is appropriately selected within the range of 0.5 to 30 μm so that it is in the range of $1/3$ to $1/20$ of the targeted thickness of the cured product layer. Further, the metal powder used has a certain distribution centering on its average particle diameter, and if the average particle diameter of the metal powder used is selected so that it is in the range of $1/5$ to $1/20$ of the targeted thickness of the cured product layer, variations in the thickness of the cured product layer resulting from the particle diameter distribution of the stacked metal powder are more easily averaged. For example, by ensuring that the average particle diameter of the metal powder used is about $1/10$ of the targeted thickness of the cured product layer, the average thickness of the cured product layer of the stacked structure of the metal powder can be easily made to have a targeted thickness while achieving close contact with both the rear-surface of the semiconductor chip and the surface of the lead frame even if there is a distribution of the average particle diameter of the metal powder itself, there are variations in the thickness of the semiconductor substrate portion, or very small irregularities exist on the surface of the lead frame.

In the conductive adhesive agent according to the present invention, the above-mentioned modification of a composition is performed, whereby persistence of a solvent can be avoided when a cure treatment is carried out to produce a cured product layer for forming a conductive joint, and at the same time, the gross amount of "intrinsic" "gaseous or volatile secondary reaction products" resulting from secondary reactions occurring under heating with a heating treatment intended for a heat-curing reaction for the thermosetting resin blended as the binder resin component can be controlled.

The "intrinsic" "gaseous or volatile secondary reaction products" which are conceivable include, for example, substances involved in no reaction with the acid anhydride and remaining as an unreacted organic compound, in the organic compound forming the covering layer, on the metal surface of the ultrafine metal particles in the ultrafine particles (B), or $CO_2$ produced by decarbonation from a carboxy group produced by the acid anhydride reacting with an epoxy resin. By performing the modification of the blended amount as described above, the produced amount "intrinsic" "gaseous or volatile secondary reaction products" can be controlled, and resultantly the ratio of weight loss F (%) defined by the above equation 2, resulting from gas generation other than volatilization of the solvent can be limited within the range of nor exceeding 3% at most. Further, in the conductive adhesive agent according to the present invention, if the above-mentioned suitable range of the blended amount is selected for each component, the ratio of weight loss F(%) defined by the above equation 2, resulting from gas generation other than volatilization of the solvent can be limited within the range of nor exceeding 2.5%, more preferably 2%, in many cases.

The "intrinsic" "gaseous or volatile secondary reaction products" are produced as the curing of the thermosetting resin proceeds, and therefore cause formation of voids in the central portion if they cannot diffuse through a liquid phase, and effectively dissipate from the side face through a layer-to-layer space closed on the upper and lower sides by the metal surfaces to be jointed. Their gross amount is equivalent to the ratio of weight loss F (%) resulting from gas generation other than volatilization of the solvent, but as a result of controlling this amount, formation of voids can be avoided, or the degree of formation of voids can be considerably reduced. Particularly, formation of voids caused by the gas components is a phenomenon limited to the interface between the rear-surface of the semiconductor chip on the upper side and the upper surface of the cured product layer, and hinders the contact between the heat flow channel based on the stacked structure of the metal powder in the cured product layer and the rear-surface of the semiconductor chip, but this phenomenon can be avoided if the conductive adhesive agent according to the present invention is used.

The metal powder that is used in the conductive adhesive agent according to the present invention is used for formation of the current flow channel and the main heat flow channel in the cured product layer of the formed conductive joint portion as described above, and for the metal powder, at least one type of metal material selected from the group consisting of silver, copper, gold, platinum, nickel, zinc, bismuth and tungsten is used. Normally, it is preferable that the metal material corresponding to ultrafine metal particles used in conjunction is also selected from the group consisting of silver, copper, gold, platinum, nickel, zinc and bismuth. Among them, silver, copper, gold and platinum are metal materials especially excellent in both the electrical conductivity and thermal conductivity, and there are more preferably used.

Furthermore, the process for manufacturing an article according to the present invention is a technique that applies the advantage of the conductive joint by means of the above-mentioned conductive adhesive agent according to the present invention, and is generally a process for manufacturing an article comprising a conductive jointing body, and a first member and a second member bound together by the conductive jointing body, comprising the step of:

holding said first member and second member via the conductive adhesive agent having the above-mentioned constitutions according to the present invention, and heating said conductive adhesive agent to obtain said conductive jointing body therebetween, whereby the binding is attained.

Particularly, the process for manufacturing an article according to the present invention gives a more preferable result when the process is carried out in such a manner where a semiconductor chip is selected as the first member, and a lead frame is selected as the second member, i.e. the above-mentioned conductive adhesive agent according to the present invention is used in a step of die-mounting the semiconductor on the lead frame.

One typical example of embodiments of application of the technique to manufacture of the semiconductor device is an embodiment in which in the step of die-mounting the semiconductor chip on the lead frame in the process of manufacturing a resin mold type semiconductor device, the conductive adhesive agent according to the present invention is used as a die-mounting agent for binding them with use of conductive joint. Generally, the process of manufacturing this type of resin mold type semiconductor device comprises the steps of:

supplying the die-mounting agent onto the lead frame as;
mounting the semiconductor element on the die-mounting agent;
heat-curing the die-mounting agent to form a conductive joint;
bonding between the semiconductor element and the lead frame by a metal wire; and
sealing with resin at least part of the lead frame, the die-mounting agent, the semiconductor element and the metal wire, and by using as the die-mounting agent the conductive adhesive agent according to the present invention having the above-mentioned constitution, a conductive joint having a good electrical conductivity and thermal conductivity can be achieved.

The temperature of the cure treatment of the conductive adhesive agent according to the present invention, which is used as the die-mounting agent, may be set to be within the range of 190° C. to 320° C., more preferably 190° C. to 310° C. depending on the type of blended thermosetting resin. At this time, by setting the cure treatment temperature to at least 190° C. or higher, the process of low-temperature sintering of ultrafine metal particles having a principal role in achievement a conductive joint exhibiting a good electrical conductivity and thermal conductivity can be made to sufficiently proceed, and thus a preferable heating condition is provided. If the heating temperature is about 320° C., an influence on the properties of the semiconductor element formed on the surface portion of the semiconductor chip can be sufficiently accepted. The cure treatment temperature can be set to be 300° C. or lower, normally about 250° C., and when conductive jointing using tin-lead solder is used, a heating condition equivalent to the heating temperature, i.e. about 250° C. to 300° C., at which solder melting is carried out, can be used. Further, it is more preferable that prior to the heat curing of the thermosetting resin (C), a preliminary curing step of carrying out preliminary heating at a temperature of 80° C. to 130° C., preferably 90° C. to 130° C. is provided for preliminarily transpiring and removing the solvent (D) blended in the conductive adhesive agent according to the present invention, for the purpose of adjusting the liquid adjustment for satisfying the operability during coating.

In addition, by using the conductive adhesive agent according to the present invention and selecting the cure treatment temperature described above, for example, the thermal conductivity of the formed conductive joint portion reaches at least 8 W/mK or greater, and 10 W/mK or greater in most cases, on the basis of the thermal conductivity of the joint portion.

EXAMPLES

The present invention will be explained more specifically below by showing specific examples. Each of the specific example is an example of the best modes according to the present invention, but the technical scope of the present invention is not limited by these specific examples.

Examples 1-1 to 1-8 and Comparative Examples 1-1 to 1-3

The ratio of blended amounts of a metal powder (A), ultrafine particles (B), a thermosetting resin (C) and a solvent (D), which are essential components in a conductive adhesive agent, is selected variously, and conductive adhesive agents of examples 1-1 to 1-8 and conductive adhesive agents of comparative examples 1-1 to 1-3 are prepared according to the following procedures.

Silver ultrafine particles having a covering layer of Polyoxyalkyleneamine on the metal surfaces thereof, which are used as the ultrafine particles (B), are prepared by the following process.

A commercially available ultrafine particle dispersion of silver (trade name: Independently dispersive Ultrafine Particles Ag 1TH1, ALVAC Corporate Center Co., Ltd.) is used to prepare a dispersion solution of silver ultrafine particle having an average particle diameter of 3 nm, which comprises 6 parts by weight of Jefamine T403 as polyoxyalkyleneamine and 59 parts by weight of toluene as an organic solvent, per 35 parts by weight of silver ultrafine particles contained therein. Using an evaporator, a dispersing solvent, toluene, contained in the dispersion of the silver ultrafine particles (35 wt % Ag 1TH1) is evaporated away, and silver ultrafine particles with the surface covered with polyoxyalkyleneamine are collected as a dry powder.

A thermosetting epoxy resin composition containing a silane-coupling agent, in addition to an epoxy resin and an acid anhydride as a curing agent thereof, which are resin constituting components, is prepared as the thermosetting resin (C) in the following manner. In a stirring container are added a dibasic acid modified epoxy resin (Epicoat 871, Japan Epoxy Resin Co., Ltd., epoxy equivalent: 420 g/eq.), a rubber modified epoxy resin (EPR1309, Asahi Denka Co., Ltd., epoxy equivalent: 300 g/eq.), a silane-coupling agent (AZ6165, Nippon Unicar Company limited) and an acid anhydride (Liquacid DDSA, New Japan Chemical Co., Ltd., acid anhydride equivalent: 130 g/eq.). These components are sufficiently stirred and mixed to prepare a uniform liquid mixture, which is used as the thermosetting resin composition.

According to the procedure described below, the metal powder (A) and the ultrafine particles (B) are added in the thermosetting resin composition as metal components that are used for a conductive medium, and the resultant mixture is uniformly kneaded to prepare a silver pasty mixture. To the beforehand prepared resin component for use as the thermosetting resin (C) are added a spherical silver powder (Ag-5-7A, Dowa Mining Co., Ltd.) having an average particle diameter of 3 μm and a scaly silver powder (AgC-239, Fukuda Metal Foil Powder Co., Ltd.) having an average particle diameter of 3 μm as the metal powder (A), and the silver ultrafine particles subjected to the dry powderization as the ultrafine particles (B), and the resultant mixture is sufficiently stirred and mixed to prepare a uniform silver pasty mixture.

To the silver pasty mixture obtained is added the solvent (D), and the fluid viscosity is adjusted to prepare a conductive adhesive agent. Here, diethylene glycol diethyl ether (boiling point: 188.4° C./1013 hPa) is used as the solvent (D), it is added to the silver pasty mixture in a predetermined ratio, and the resultant mixture is sufficiently stirred and mixed to adjust the fluid viscosity to be around 20 Pa·s (25° C.).

The compositions of the prepared conductive adhesive agents are shown in Tables 1 and 2.

For the conductive adhesive agent prepared, the amount of reduction in total weight caused by components dissipating into a vapor phase as a heating treatment is carried out under predetermined conditions for volatizing the contained solvent and curing the thermosetting resin is measured by the following evaluation method.

The conductive adhesive agent to be evaluated is coated on the bottom of a measuring cup of Tg-DTA to prepare a measurement sample. Here, a φ5 mm cup made of aluminum is used as the measuring cup. A predetermined amount of conductive adhesive agent sample is fed into the cup, a Teflon bar having a diameter identical to that of the inner wall of the measuring cup, i.e. a Teflon bar of φ5 mm is used to push the liquid sample against the bottom of the cup to fix its surface shape. After this fixation processing, the weight of the conductive adhesive agent sample before the heat treatment is measured. At this time, the feed amount of conductive adhesive agent sample is adjusted so that the weight of the sample before the heating treatment is 15±1 mg.

The coated layer sample of the conductive adhesive agent subjected to fixation of the surface shape is heated from 30° C. to 250° C. at a rate of temperature rise of 10° C./min under an atmosphere of argon gas (flow rate: 100 ml/min), and then the amount of change in weight of the sample is measured using Tg-DTA while a heating treatment is carried out with a temperature profile for holding the sample at 250° C. for 60 minutes.

Based on the feed amount of the original conductive adhesive agent sample, the composition of the conductive adhesive agent and the results of measurement of the amount of change in weight, the ratio of weight loss F (%) resulting from gas generation other than volatilization of the solvent is calculated according to the following definition.

Here, where when the conductive adhesive agent of which the amount W is 100 parts by weight is subjected to a heating treatment, the amount of reduction in total weight resulting from components dissipated into a vapor phase with the heating treatment is defined as E, the amount of the solvent contained in the conductive adhesive agent of the amount W and volatilized is defined as $D_1$, the amount of the metal powder contained in the conductive adhesive agent of the amount W is defined as $A_1$, the amount of the ultrafine particles contained in the conductive adhesive agent of the amount W is defined as $B_1$, and the amount of the thermosetting resin contained in the conductive adhesive agent of the amount W is defined as $C_1$, the amount α of reduction in weight exclusive of the amount $D_1$ of the solvent volatilized, in the amount E of reduction in total weight resulting from components dissipated into the vapor phase, is defined as equation 1: $\alpha = E - D_1$, and the ratio of weight loss F (%) resulting from gas generation other than volatilization of the solvent is defined as equation 2: $F = \{\alpha/(A_1+B_1+C_1)\} \times 100$.

The ratio of weight loss F (%) is equivalent to a ratio of the "gaseous or volatile secondary reaction products" gasified and dissipated among secondary reaction products produced by secondary reactions as a heat-curing reaction by resin constituting components in the thermosetting resin (C) (in this case, a polymerization reaction between an epoxy resin and an acid anhydride as a curing agent thereof) proceeds, in relation to the total obtained "heat-cured product".

TABLE 1

| | Comp. Ex. 1-1 | Ex. 1-1 | Ex. 1-2 | Ex. 1-3 | Ex. 1-4 | Com. Ex. 1-2 |
|---|---|---|---|---|---|---|
| Spherical silver powder | 70.37 | 71.39 | 70.88 | 69.39 | 68.80 | 68.03 |
| Scaly silver powder | 17.59 | 17.85 | 17.72 | 17.35 | 17.20 | 17.01 |
| (Silver powder total) | 87.96 | 89.24 | 88.60 | 86.74 | 86.00 | 85.04 |
| Silver nanoparticles | 1.85 | 1.87 | 1.86 | 1.82 | 1.81 | 1.79 |
| Epicoat 871 | 1.93 | 2.59 | 3.69 | 4.37 | 5.47 | 6.38 |
| EPR1309 | 0.30 | 0.40 | 0.63 | 0.76 | 0.94 | 1.14 |
| Acid anhydride | 1.33 | 1.79 | 2.82 | 3.40 | 4.25 | 5.11 |
| Coupling agent | 0.09 | 0.12 | 0.19 | 0.23 | 0.19 | 0.34 |
| (Resin component total) | 3.65 | 4.90 | 7.33 | 8.76 | 10.85 | 12.97 |
| Solvent | 6.54 | 3.66 | 2.21 | 2.68 | 1.34 | 0.20 |
| Equivalent ratio of epoxy/curing agent | 0.94 | 0.94 | 1.02 | 1.04 | 1.04 | 1.06 |
| Ratio of resin component/metal component | 3.9/96.1 | 5.1/94.9 | 7.5/92.5 | 9.0/91.0 | 11.0/89.0 | 13.0/87.0 |
| Ratio of silver nanoparticle/silver powder | 2.1/97.9 | 2.1/97.9 | 2.1/97.9 | 2.1/97.9 | 2.1/97.9 | 2.1/97.9 |
| Viscosity Pa · s (10 rpm) | 20.8 | 21.8 | 17.0 | 12.9 | 15.6 | 23.2 |
| F | 2.6% | 2.0% | 2.2% | 2.0% | 2.3% | 4.8% |

Content: in unit of parts by weight
Metal component: represents the total amount of metal powder (A) and ultrafine particles (B)
Silver powder: represents the total amount of spherical silver powder and scaly silver powder

TABLE 2

| | Com. Ex. 2-1 | Ex. 1-5 | Ex. 1-6 | Ex. 1-7 | Ex. 1-8 | Com. Ex. 1-3 |
|---|---|---|---|---|---|---|
| Spherical silver powder | 72.07 | 71.70 | 70.87 | 68.97 | 75.50 | 62.31 |
| Scaly silver powder | 18.02 | 17.95 | 17.72 | 17.24 | 8.39 | 15.58 |
| (Silver powder total) | 90.09 | 89.74 | 88.59 | 86.21 | 83.89 | 77.89 |
| Silver nanoparticles | — | 0.94 | 1.86 | 3.58 | 5.20 | 8.57 |
| Epicoat 871 | 3.57 | 3.61 | 3.69 | 3.70 | 3.95 | 2.37 |
| EPR1309 | 0.64 | 0.65 | 0.63 | 0.56 | 0.56 | 0.47 |
| Acid anhydride | 2.90 | 2.90 | 2.82 | 2.85 | 2.54 | 2.13 |
| Coupling agent | 0.19 | 0.19 | 0.19 | 0.17 | 0.17 | 0.14 |
| (Resin component total) | 7.30 | 7.35 | 7.33 | 7.28 | 7.22 | 5.11 |
| Solvent | 2.61 | 1.97 | 2.22 | 2.93 | 3.69 | 6.54 |
| Equivalent ratio of epoxy/curing agent | 1.08 | 1.06 | 1.02 | 1.05 | 0.89 | 1.10 |
| Ratio of resin component/metal component | 7.5/92.5 | 7.5/92.5 | 7.5/92.5 | 7.5/92.5 | 7.5/92.5 | 7.5/92.5 |
| Ratio of silver nanoparticle/silver powder | — | 1.0/99.0 | 2.1/97.9 | 4.1/95.9 | 6.2/93.8 | 11.0/89.0 |
| Viscosity Pa · s (10 rpm) | 19.2 | 23.0 | 17.0 | 20.7 | 24.3 | 24.2 |
| F | 1.9% | 1.9% | 2.3% | 2.3% | 1.8% | 3.8% |

Content: in unit of parts by weight
Metal component: represents the total amount of metal powder (A) and ultrafine particles (B)
Silver powder: represents the total amount of spherical silver powder and scaly silver powder

Examples 1-10 to 1-13

The ultrafine particles (B) and the metal powder (A) are used as conductive media, and a conductive adhesive agent containing the metal powder (A), the ultrafine particles (B), the thermosetting resin (C) and the solvent (D) as major constituent parts is prepared according to the following procedures. At this time, the blending ratio of the spherical silver powder to the scaly silver powder is selected variously, and 4 types of conductive adhesive agents of examples 1-10 to 1-13 are fabricated.

As the thermosetting resin (C), a thermosetting epoxy resin composition containing an epoxy resin, an acid anhydride as a curing agent thereof, and a silane-coupling agent is prepared in the following manner. In a stirring container are added a dibasic acid modified epoxy resin (Epicoat 871, Japan Epoxy Resin Co., Ltd.), a rubber modified epoxy resin (EPR1309, Asahi Denka Co., Ltd.), a silane-coupling agent (AZ6165, Nippon Unicar Company limited) and an acid anhydride (Liquacid DDSA, New Japan Chemical Co., Ltd., acid anhydride equivalent: 130 g/eq.). these components are sufficiently stirred and mixed to prepare a uniform liquid mixture, and the liquid mixture is used as the thermosetting resin component.

According to the procedure described below, the ultrafine particles (B) and the metal powder (A) are added in the thermosetting resin composition as metal components that are used for a conductive medium, and the resultant mixture is uniformly kneaded to prepare a silver pasty mixture. To the beborehand prepared resin component for use as the thermosetting resin (C) are added the silver ultrafine particles subjected to the dry powderization as the ultrafine particles (B) and a spherical silver powder (Ag-5-7A, Dowa Mining Co., Ltd.) having an average particle diameter of 3 µm and a scaly silver powder (AgC-239, Fukuda Metal Foil Powder Co., Ltd.) having an average particle diameter of 3 µm as the metal powder (A) in a variety of ratios, and the resultant mixture is sufficiently stirred and mixed to prepare a uniform silver pasty mixture.

To the obtained silver pasty mixture is added the solvent (D), and the fluid viscosity is adjusted to prepare a conductive adhesive agent. Here, diethylene glycol diethyl ether (boiling point: 188.4° C./1013 hPa) is used as the solvent (D), it is added to the silver pasty mixture in a predetermined ratio, and the resultant mixture is sufficiently stirred and mixed to adjust the fluid viscosity to be about 20 Pa·s (25° C.).

The compositions of the conductive adhesive agents of the examples 1-10 to 1-13 are shown in Table 3.

For the conductive adhesive agent prepared, the amount of reduction in total weight caused by components dissipating into a vapor phase as a heating treatment is carried out under predetermined conditions for transpiring the contained solvent and curing the thermosetting resin is measured by the evaluation method described above.

Based on the feed amount of the original conductive adhesive agent sample, the composition of the conductive adhesive agent and the results of measurement of the amount of change in weight, the ratio of weight loss F(%) resulting from gas generation other than volatilization of the solvent is calculated according to the following definition.

TABLE 3

|  | Ex. 1-10 | Ex. 1-11 | Ex. 1-12 | Ex. 1-13 |
|---|---|---|---|---|
| Spherical silver powder | 86.93 | 68.97 | 51.50 | 25.38 |
| Scaly silver powder | — | 17.24 | 34.33 | 59.21 |
| (Silver powder total) | 86.93 | 86.21 | 85.83 | 84.59 |
| Silver nano-particles | 3.61 | 3.58 | 3.56 | 3.51 |
| Epicoat 871 | 3.68 | 3.70 | 3.65 | 3.59 |
| EPR1309 | 0.57 | 0.56 | 0.56 | 0.58 |
| Acid anhydride | 2.92 | 2.85 | 2.88 | 2.80 |
| Coupling agent | 0.17 | 0.17 | 0.17 | 0.17 |
| (Resin component total) | 7.34 | 7.28 | 7.26 | 7.14 |
| Solvent | 2.12 | 2.93 | 3.35 | 4.76 |
| Equivalent ratio of epoxy/curing agent | 1.08 | 1.05 | 1.08 | 1.05 |
| Ratio of resin component/metal component | 7.5/92.5 | 7.5/92.5 | 7.5/92.5 | 7.5/92.5 |
| Ratio of silver nanoparticle/silver powder | 4.1/95.9 | 4.1/95.9 | 4.1/95.9 | 4.1/95.9 |
| Viscosity Pa · s (10 rpm) | 26.0 | 20.0 | 24.5 | 27.2 |
| F | 2.1% | 2.2% | 2.1% | 2.3% |

Content: in unit of parts by weight

Metal component: represents the total amount of metal powder (A) and ultrafine particles (B)

Silver powder: represents the total amount of spherical silver powder and scaly silver powder Comparative Example 2-1

The ultrafine particles (B) are not blended but only the metal powder (A) is used as a conductive medium, and a conventional conductive adhesive agent containing the metal powder (A), the thermosetting resin (C) and the solvent (D) as major constituent parts is prepared according to the following procedures.

As the thermosetting resin (C), a thermosetting epoxy resin composition having as components an epoxy resin, an acid anhydride as a curing agent thereof, and a silane-coupling agent is prepared in the following manner. In a stirring container are added a dibasic acid modified epoxy resin (Epicoat 871, Japan Epoxy Resin Co., Ltd.), a rubber modified epoxy resin (EPR1309, Asahi Denka Co., Ltd.), a silane-coupling agent (AZ6165, Nippon Unicar Company limited) and an acid anhydride (Liquacid DDSA manufactured by New Japan Chemical Co., Ltd.). These components are sufficiently stirred and mixed to prepare a uniform liquid mixture, and the liquid mixture is used as the thermosetting resin component.

According to the procedure described below, only the metal powder (A) is added in the thermosetting resin composition as metal components that are used for a conductive medium, and the resultant mixture is uniformly kneaded to prepare a silver pasty mixture. To the beforehand prepared resin component for use as the thermosetting resin (C) are added a spherical silver powder (Ag-5-7A manufactured by Dowa Mining Co., Ltd.) having an average particle diameter of 3 µm and a scaly silver powder (AgC-239 manufactured by Fukuda Metal Foil Powder Co., Ltd.) having an average particle diameter of 3 µm as the metal powder (A), and the resultant mixture is sufficiently stirred and mixed to prepare a uniform silver pasty mixture.

To the obtained silver pasty mixture is added the solvent (D), and the fluid viscosity is adjusted to prepare a conductive adhesive agent. Here, diethylene glycol diethyl ether (boiling point: 188.4° C./1013 hPa) is used as the solvent (D), it is added to the silver pasty mixture in a predetermined ratio, and the resultant mixture is sufficiently stirred and mixed to adjust the fluid viscosity to be about 20 Pa·s (25° C.).

The composition of the conductive adhesive agent of this comparative example 2-1 is shown in Table 2.

For the conductive adhesive agent prepared, the amount of reduction in total weight caused by components dissipating into a vapor phase as a heating treatment is carried out under predetermined conditions for transpiring the contained solvent and curing the thermosetting resin is measured by the evaluation method described above.

Based on the feed amount of the original conductive adhesive agent sample, the composition of the conductive adhesive agent and the results of measurement of the amount of change in weight, the ratio of weight loss F(%) resulting from gas generation other than volatilization of the solvent is calculated according to the following definition.

Comparative Example 2-2

The ratio of blended amounts of a metal powder (A), ultrafine particles (B), a thermosetting resin (C) and a solvent (D), which are essential components in a conductive adhesive agent, is selected variously, and dibutyl adipate which is an organic solvent showing a boiling point of 250° C. or higher in an atmosphere of 1013 hPa (1 atmospheric pressure) is used to prepare a conductive adhesive agent of the comparative example 2-2.

Silver ultrafine particles having a covering layer of polyoxyalkyleneamine on the metal surface, which are used as the ultrafine particles (B), are prepared by the following process.

A commercially available ultrafine particle dispersion of silver (trade name: Independent dispersion Ultrafine Particles Ag 1TH1, ALVAC Corporate Center Co., Ltd.) is used to prepare a silver ultrafine particle dispersion containing 6 parts by weight of Jefamine T403 as polyoxyalkyleneamine and 59 parts by weight of toluene as an organic solvent per 35 parts by weight of contained silver ultrafine particles and having an average particle diameter of 3 nm. Using an evaporator, a dispersing solvent, toluene, contained in the dispersion of the silver ultrafine particles (35 wt % Ag 1TH1) is evaporated away, and silver ultrafine particles with the surface covered with polyoxyalkyleneamine are collected as a dry powder.

As the thermosetting resin (C), a thermosetting epoxy resin composition having as components an epoxy resin, an acid anhydride as a curing agent thereof, and a silane-coupling agent is prepared in the following manner. In a stirring container are added a dibasic acid modified epoxy resin (Epicoat 871, Japan Epoxy Resin Co., Ltd.), a rubber modified epoxy resin (EPR1309, Asahi Denka Co., Ltd.), a silane-coupling agent (AZ6165, Nippon Unicar Company limited) and an acid anhydride (Liquacid DDSA, New Japan Chemical Co., Ltd.). These components are sufficiently stirred and mixed to prepare a uniform liquid mixture, and the liquid mixture is used as the thermosetting resin component.

According to the procedure described below, the metal powder (A) and the ultrafine particles (B) are added in the thermosetting resin composition as metal components that are used for a conductive medium, and the resultant mixture is uniformly kneaded to prepare a silver pasty mixture. To the beforehand prepared resin component for use as the thermosetting resin (C) are added a spherical silver powder (Ag-5-7A, Dowa Mining Co., Ltd.) having an average particle diameter of 3 μm and a scaly silver powder (AgC-239, Fukuda Metal Foil Powder Co., Ltd.) having an average particle diameter of 3 μm as the metal powder (A), and the silver ultrafine particles subjected to the dry powderization as the ultrafine particles (B), and the resultant mixture is sufficiently stirred and mixed to prepare a uniform silver pasty mixture.

To the obtained silver pasty mixture is added the solvent (D), and the fluid viscosity is adjusted to prepare a conductive adhesive agent. Here, dibutyl adipate (boiling point: 305° C./1013 hPa) is used as the solvent (D), it is added to the silver pasty mixture in a predetermined ratio, and the resultant mixture is sufficiently stirred and mixed to adjust the fluid viscosity to be around 20 Pa·s (25° C.).

The composition of the prepared conductive adhesive agent of the comparative example 2-2 is shown in Tables 4.

TABLE 4

|  | Com. Ex. 2-2 |
| --- | --- |
| Spherical silver powder | 68.25 |
| Scaly silver powder | 17.06 |
| (Silver powder total) | 85.31 |
| Silver nanoparticles | 3.46 |
| Epicoat 871 | 3.70 |
| EPR1309 | 0.56 |
| Acid anhydride | 2.77 |
| Coupling agent | 0.17 |
| (Resin component total) | 7.28 |
| Solvent | 1.02 |
| Equivalent ratio of epoxy/curing agent | 4.03 |
| Ratio of resin component/metal component | 7.5/92.5 |
| Ratio of silver nanoparticle/silver powder | 4.1/95.9 |
| Viscosity Pa·s (10 rpm) | 19.0 |
| F | 4.5% |

Content: in unit of parts by weight

Metal component: represents the total amount of metal powder (A) and ultrafine particles (B)

Silver powder: represents the total amount of spherical silver powder and scaly silver powder Example 2

For the conductive adhesive agents of the examples 1-1 to 1-8, the conductive adhesive agents of the examples 1-10 to 1-13, the conductive adhesive agents of the comparative examples 1-1 to 1-3 and the conductive adhesive agents of the comparative examples 2-1 and 2-2 prepared by variously selecting the ratio of blended amounts of the metal powder (A), the ultrafine particles (B), the thermosetting resin (C) and the solvent (D) which are essential components in the conductive adhesive agent described above, the results of evaluations of the joint state in conductive jointing using these conductive adhesive agents, existence/nonexistence of voids formed on the joint surface, and the thermal conductivity of the conductive joint portion, and the results of the ratio of weight loss F evaluated for these conductive adhesive agents themselves are collectively shown in Tables 5, 6, 7 and 8.

In the results of evaluations shown in Table 8, the results of evaluations of performance of joints in the conductive adhesive agent of the example 1-11 and the conductive adhesive agent of the comparative example 2-2 having similar compositions with the former in contrast with the latter. When the conductive adhesive agent of the comparative example 2-2 was used, formation of voids and the frequency of detachment at the interface were significant, variations in the degree thereof were prominent, and therefore the evaluation of the thermal conductivity by the laser-flash method could not be carried out.

For a sample for evaluation of the conductive joint performance, a sample in which a Si chip provided on the rear-surface with a gold deposited film layer for jointing is joined onto a Cu plate via the conductive adhesive agent is fabricated according to the procedure described below.

A predetermined amount of conductive adhesive agent is fed by a dispenser onto a Cu plate processed into a size of 10 mm (L)×10 mm (W)×1 mm (T) in advance. A rectangular Si chip having a chip size of 8.5 mm (L)×8.5 mm (W)×0.3 mm (T) and provided on the rear-surface with a gold deposited film layer for jointing is mounted on a coating portion of the conductive adhesive agent using a die bonder. Then, under an inert gas atmosphere (nitrogen gas atmosphere) in a temperature controlled chamber, the sample is held at 90° C. for 1 hour to volatilize and volatilize a solvent contained in the conductive adhesive agent as a preliminary curing treatment step, and subsequently the sample is heated to 200° C., and held at the temperature to cure a thermosetting resin contained in the conductive adhesive agent as a main curing treatment step.

In this preliminary curing treatment step, as the solvent is progressively volatilized, the metal powder dispersed in the conductive adhesive agent is stacked, and the face of the gold deposited film on the surface of the Cu plate and the rear-surface of the Si chip is in physical contact with the metal powder layer of stacked structure. Then, in the main curing treatment step, as the thermosetting resin is cured, the produced resin cured product is bonded to the face of the gold deposited film on the surface of the Cu plate and the rear-surface of the Si chip, and at the same time, the cured thermosetting resin functions as a binder resin component achieving a state of close contact between metal powders in the metal powder layer of stacked structure.

Then, for the sample that has been subjected to the curing treatment, existence/nonexistence of voids formed in the joint portion is observed by a transmission X-ray apparatus, and the joint state in the interface region between the cured product of the conductive adhesive agent and the face of the gold coated film on the rear-surface of the Si chip, especially existence/nonexistence of detachment is checked by cross-section observation. In addition, the thermal conductivity is measured by the laser-flash method for checking whether or not a low-heat resistance joint portion is formed by the conductive jointing.

TABLE 5

Results of evaluation of effect of the added amount of thermosetting resin on Tg weight loss ratio and joint performance

|  | Com. Ex. 1-1 | Ex. 1-1 | Ex. 1-2 | Ex. 1-3 | Ex. 1-4 | Com. Ex. 1-2 |
|---|---|---|---|---|---|---|
| Ratio of resin/silver | 3.9/96.1 | 5.1/94.9 | 7.5/92.5 | 9.0/91.0 | 11.0/89.0 | 13.0/87.0 |
| Ratio of weight loss F | 2.6 wt % | 2.0 wt % | 2.2 wt % | 2.0 wt % | 2.3 wt % | 4.8 wt % |
| Voids | X | ○ | ○ | ○ | ○ | ○ |
| Joint state | Detachment observed | No detachment observed | No detachment observed | No detachment observed | No detachment observed | No detachment observed |
| Thermal conductivity W/mK | 7.8 | 10.2 | 10.9 | 10.5 | 10.2 | 4.2 |
| Overall Judgment | X | ○ | ○ | ○ | ○ | X |

Ratio of resin/silver: represents the weight ratio of (total of resin components)/(silver powder+silver nano-particles)

Judgment on voids: acceptable if the ratio of the area of the void formation region to the joint portion area is 5% or less

TABLE 6

Results of evaluation of effect of the added amount of silver nano-particles under fixed thermosetting resin on Tg weight loss ratio and joint performance

|  | Com. Ex. 2-1 | Ex. 1-5 | Ex. 1-6 | Ex. 1-7 | Ex. 1-8 | Com. Ex. 1-3 |
|---|---|---|---|---|---|---|
| Silver nanoparticles (/silver powder) | — | 1.0/99.0 | 2.1/97.9 | 4.1/95.9 | 6.2/93.8 | 11.0/89.0 |
| Ratio of resin/silver | 7.5/92.5 | 7.5/92.5 | 7.5/92.5 | 7.5/92.5 | 7.5/92.5 | 7.5/92.5 |
| Ratio of weight loss F | 1.9 wt % | 1.9 wt % | 2.3 wt % | 2.3 wt % | 1.8 wt % | 3.8 wt % |
| Voids | ○ | ○ | ○ | ○ | ○ | X |
| Joint state | No detachment observed | No detachment observed | No detachment observed | No detachment observed | No detachment observed | Detachment observed |
| Thermal conductivity W/mK | 2.6 | 10.1 | 11.6 | 15.6 | 10.4 | 3.3 |
| Overall Judgment | X | ○ | ○ | ○ | ○ | X |

Ratio of resin/silver: represents the weight ratio of (total of resin components)/(silver powder+silver nano-particles)

Judgment on voids: acceptable if the ratio of the area of the void formation region to the joint portion area is 5% or less

TABLE 7

Results of evaluation of effect of the blending ratio of spherical silver powder/scaly silver powder under fixed thermosetting resin on Tg weight loss ratio and joint performance

|  | Ex. 1-10 | Ex. 1-11 | Ex. 1-12 | Ex. 1-13 |
|---|---|---|---|---|
| Silver nanoparticles (/silver powder) | 4.1/95.9 | 4.1/95.9 | 4.1/95.9 | 4.1/95.9 |
| Spherical silver powder/ scaly silver powder | 10/0 | 8/2 | 6/4 | 3/7 |

TABLE 7-continued

Results of evaluation of effect of the blending ratio of spherical silver powder/scaly silver powder under fixed thermosetting resin on Tg weight loss ratio and joint performance

|  | Ex. 1-10 | Ex. 1-11 | Ex. 1-12 | Ex. 1-13 |
|---|---|---|---|---|
| Ratio of resin/silver | 7.5/92.5 | 7.5/92.5 | 7.5/92.5 | 7.5/92.5 |
| Ratio of weight loss F | 2.1 wt % | 2.2 wt % | 2.1 wt % | 2.3 wt % |
| Voids | ○ | ○ | ○ | x |
| Joint state | No detachment observed | No detachment observed | No detachment observed | Detachment observed |
| Thermal conductivity W/mK | 10.1 | 15.6 | 10.7 | 9.1 |
| Overall Judgment | ○ | ○ | ○ | ○ |

Ratio of resin/silver: represents the weight ratio of (total of resin components)/(silver powder+silver nanoparticles)

Judgment on voids: acceptable if the ratio of the area of the void formation region to the joint portion area is 5% or less

TABLE 8

Results of evaluation of effect of difference in boiling point of solvent on Tg weight loss ratio and joint performance

|  | Ex. 1-11 | Com. Ex 2-2 |
|---|---|---|
| Silver nanoparticles (/silver powder) | 4.1/95.9 | 4.1/95.9 |
| Boiling point of solvent | 188.4?/ 1013 hPa | 305° C./ 1013 hPa |
| Ratio of resin/silver | 7.5/92.5 | 7.5/92.5 |
| Ratio of weight loss F | 2.2 wt % | 4.5 wt % |
| Voids | ○ | x |
| Joint state | No detachment observed | Detachment observed |
| Thermal conductivity W/mK | 15.6 | — |
| Overall Judgment | ○ | x |

Ratio of resin/silver: represents the weight ratio of (total of resin components)/(silver powder+silver nano-particles)

Judgment on voids: acceptable if the ratio of the area of the void formation region to the joint portion area is 5% or less From the results shown in Tables 5 to 8, for the conductive adhesive agent according to the present invention, the amount of "gaseous or volatile secondary reaction products" gasified and dissipated among secondary reaction products produced by secondary reactions when the main curing treatment intended for a heat-curing reaction after the contained solvent is volatilized during the preliminary curing treatment is small, and therefore factors causing formation of voids and detachment resulting from accumulation of the "gaseous or volatile secondary reaction products" on the interface of the joint portion are reduced. Particularly, if formation of voids and detachment at the interface are inhibited, a joint portion excellent in thermal conductivity can be obtained. In addition, by ensuring that the fabricated conductive joint portion is free from voids and detachment at the interface, progressive expansion of detachment at the interface, for example during subsequent application of a temperature cycle is also inhibited, and therefore long-term reliability of the joint portion is improved.

Example 3

A step of die-bonding a semiconductor chip onto a lead frame using the conductive adhesive agents of the examples 1-2, 1-7 and 1-13 described above, and they are subjected to gold line wire bonding, and then subjected to resin molding to fabricate a resin mold type semiconductor device, and then the heat resistance in a package state reflecting a thermal conductivity property through the conductive joint portion mainly from the rear-surface of the semiconductor chip to the lead frame, and variations in the heat resistance after a temperature cycle test are evaluated in the following manner.

The outline of a step of assembling the resin mold type semiconductor device used here is shown in FIG. 1. First, a predetermined amount of conductive adhesive agent is coated on a region where a semiconductor chip 2 is die-mounted on a lead frame 1. Then, the semiconductor chip 2 is mounted on the conductive adhesive agent coated portion by a die bonder, and the rear-surface of the semiconductor chip 2 as a joint surface is brought into close contact with the conductive adhesive agent coated layer. A heating treatment is carried out to cure the conductive adhesive agent, thus completing die bonding. Wire bonding is established between an electrode pad on the upper surface of the mounted semiconductor chip 2 and a bonding pad on the lead frame 1 using, for example, a gold line as a bonding wire 5. Finally, transfer molding is carried out using a thermosetting resin for molding for covering with a resin mold 6 the entire surfaces of the die mount region of the lead frame 1, the semiconductor chip 2 and the bonding wire 5 except for a lead portion of the lead frame 1.

The lead frame that is used in this example is composed of a copper core material having a thickness of about 0.1 to 1 mm, a silver plated film is formed on the surface of the copper core material by electroplating. The thickness of this surface plated film is usually selected to be about 3 to 20 μm. For preventing used for the core material of the lead frame from being oxidized in heating treatments carried out in the above described steps, the core material is covered with a surface plated film using gold or silver.

However, for the material of the plated film covering the surface of the lead frame, a metal material other than gold and silver can be used as long as it serves a function of preventing formation of an oxide film on the surface of the lead frame. That is, plated films of various metal materials can be used as long as the plated film closely covers the copper surface of the core material, and formation of an oxide film on the surface of the metal material itself forming the plated film is inhibited to the extent that it is inhibited by the gold or silver plated film. Further, if the oxide film formed on the copper surface of the core material of the lead frame presents no particular problem, it is not necessary to provide such a plated film for preventing oxidization of the surface.

The semiconductor chip 2 has a chip size of 2 mm square and a thickness of 0.3 mm, and has a semiconductor element formed on the upper surface and a metal deposited film formed on the rear-surface. For the metal deposited film, for example, a metal material capable of being applied to solder jointing as well, such as gold, silver or palladium, is used. In this example, a deposited film layer of gold is provided on the rear-surface of the semiconductor chip 2.

Then, using, for example, the dispensing method, the conductive adhesive agent is fed to the die mount region on the lead frame 1 in an amount such that the diameter is about 500 μm and the conductive adhesive agent layer after die mounting has a thickness of about 2 to 100 μm. In a more preferable case, the conductive adhesive agent is fed in an amount such that the conductive adhesive agent layer has a thickness of about 10 to 100 μm. The semiconductor chip 2 is mounted on the conductive material coated portion by the die bonder, and the rear-surface of the semiconductor chip 2 as a joint surface is brought into close contact with the conductive adhesive agent coated layer.

Further, the lead frame 1 with the semiconductor chip 2 mounted thereon is kept under an inert gas atmosphere, and subjected to a heating treatment in a temperature-controlled chamber under the following condition. As the heating treatment condition, the lead frame 1 is held at 90° C. for 1 hour as a preliminary curing treatment, then heated, and held at 200° C. for 1 hour as a main curing treatment as in the example 2.

After die-mounting is completed, wire bonding is performed for electrical connection between the electrode pad on the upper surface of the mounted semiconductor chip 2 and the bonding pad provided in the lead portion on the lead frame 1. This example uses a method in which a gold wire of φ20 μm is used to perform wire bonding while heating the lead frame 1 at 260° C. to 300° C. to improve the joint strength of the gold wire to the pad surface.

Resin molding, which is a final step, is carried out by transfer molding using a thermosetting resin. In this example, an epoxy resin is used as the thermosetting resin, and for the molding conditions, the injection pressure is selected to be in the range of 10 to 20 MPa, the heating temperature is selected to be in the range of 160 to 220° C., and the heating time is selected to be in the range of 40 to 200 seconds.

For comparison, die-mounting is carried out in the same conditions for the conductive adhesive agent of the comparative example 2-1 in addition to the conductive adhesive agents of the examples 1-2, 1-7 and 1-13 described above, and other steps are carried out in common to fabricate 4 kinds of resin mold type semiconductor devices in all.

For 4 kinds of fabricated resin mold type semiconductor devices, an initial semiconductor device performance (initial performance) immediately after fabrication is evaluated. Particularly, whether the initial semiconductor device performance (initial performance) is good or poor is determined based on results of evaluations made for the heat resistance of the semiconductor reflecting the thermal conductivity property through the conductive joint portion from the rear-surface of the semiconductor chip to the lead frame.

Further, as one of evaluations of long-term reliability of the semiconductor device, a temperature cycle test is conducted under the following condition, and after the temperature cycle, the semiconductor device performance is evaluated. Here, the results of evaluations made under the condition in which the semiconductor device is held in a low-temperature state: at −65° C. for 30 minutes and then held in a high-temperature state: at 150° C. for 30 minutes as one cycle and 300 cycles are repeated (TCT 300 cycles) as a temperature cycle test condition are shown.

In determination on whether semiconductor device performance is good or bad, the semiconductor device is determined to be a good product if it has a value of 8 W/mK or greater when for the heat resistance of the semiconductor device reflecting the thermal conductivity property through the conductive joint portion from the rear-surface of the semiconductor chip to the lead frame, the heat resistance is converted into the thermal conductivity of the joint portion. In the "initial performance of semiconductor device (initial performance)", it is determined to be "acceptable" if the good product ratio is 100% (30/30) in 30 products randomly selected from semiconductor devices fabricated within the same lot, and it is determined to be "unacceptable" if the good product ratio is less than 100%.

In the temperature cycle test, the thermal conductivity of the joint portion before the start of the test (initial value) is compared with the thermal conductivity of the joint portion after the end of the test (final value), and the product is determined to be "good reliability" if the amount of change is 50% or less on the basis of the initial value, and the product is determined to be "poor reliability" if the amount of change is greater than 50%.

The results of evaluations are shown in Table 9.

TABLE 9

| | Ratio of weight loss F | Initial performance of semiconductor device (initial performance) | Semiconductor device performance after TCT 300 cycle |
|---|---|---|---|
| Conductive adhesive agent of Ex. 1-2 | 2.2 wt % | Acceptable | Good Reliability |
| Conductive adhesive agent of Ex. 1-7 | 2.3 wt % | Acceptable | Good Reliability |
| Conductive adhesive agent of Ex. 1-13 | 2.3 wt % | Acceptable | Good Reliability |
| Conductive adhesive agent of Com. Ex. 2-1 | 1.9 wt % | Unacceptable | Poor Reliability |

From the evaluation results shown in Table 9, when PKG (packaging) is performed using the conductive adhesive agents of the examples 1-2 and 1-7 according to the present invention in the dir-bonding step, an initial performance meeting the criterion is achieved, the rate of change in heat resistance of the semiconductor device before and after 300 cycles is 20% or less on average in the temperature cycle test, and it is thus determined that a high reliability is shown for the conductive joint portion. When PKG (packaging) is performed using the conductive adhesive agent of the example 1-13 in the die-bonding step, an initial performance meeting the criterion is achieved, the rate of change in heat resistance of the semiconductor device before and after 300 cycles is 40% or less on average in the temperature cycle test, and it is thus determined that a desired reliability is shown for the conductive joint portion. On the other hand, when PKG is performed using the conductive adhesive agent of the comparative example 2-1, an initial performance meeting the criterion is not satisfactorily obtained. Further, the rate of change in heat resistance of the semiconductor device before and after 300 cycles is as high as 70% on average in the temperature cycle test, and it is thus determined that the reliability is poor for the conductive joint portion.

As the amount of heat per unit time and unit area, generated in the semiconductor chip portion of the semiconductor device, increases, the conductive joint portion serving as a channel for dissipating the generated heat is required to have a higher thermal conductivity, and the rate of change in thermal conductivity during the temperature cycle test is required to be lower. For the higher requirement regarding the thermal conductivity property for the conductive joint portion, the ratio of the spherical metal powder to the flaky metal powder is preferably selected to be in the range of 100:0 to 50:50.

Comparison of the conductive adhesive agent of the example 1-13 with the conductive adhesive agent of the example 1-7 shows that the ratio of the spherical metal powder to the flaky metal powder in the metal powder used is different for the example 1-7 and the example 1-13, i.e. spherical silver powder/scaly silver powder=8/2 in the example 1-7 and spherical silver powder/scaly silver powder=3/7 in the example 1-13. In the condition in which the ratio of the spherical metal powder to the flaky metal powder is 8/2, a situation in which one or more spherical metal powder exists between flaky metal powders is normally achieved in the obtained conductive joint portion. On the other hand, in the condition in which the ratio of the spherical metal powder to the flaky metal powder is 3/7, the ratio of one or more spherical metal powder existing between flaky metal powders decreases and the ratio of flaky metal powders mutually contacting directly increases in the obtained conductive joint portion. If the ratio of the resin component to the silver component in the conductive adhesive agent is 1, a rise in viscosity of the pasty composition resulting from blending of the metal powder becomes more noticeable as the blending ratio of the flaky metal powder increases such that the ratio of the spherical metal powder to the flaky metal powder changes from 8/2 to 3/7. Thus, for the purpose of counteracting the rise in viscosity of the pasty composition with an increase in blending ratio of the flaky metal powder, the blending ratio of the solvent added is increased. In this case, most of the solvent added is volatilized through the preliminary curing treatment, and the ratio of the solvent remaining in the resin component is very low. That is, the solvent having a capability of reducing the fluid viscosity exists only in a very small amount, and therefore the flowability of the pasty composition itself that has been subjected to the preliminary curing treatment noticeably decreases. When a heating treatment is carried out to cure the thermosetting resin and perform low-temperature sintering of ultrafine metal particles in the subsequent main curing treatment, the lower the flowability of the pasty composition itself that has been subjected to the preliminary curing treatment, the more difficult it is for internally generated "intrinsic" "gaseous or volatile secondary reaction products" to dissipate, thus increasing the rate of formation of voids. For example, if voids formed at the interface between the obtained conductive joint portion and the semiconductor chip are accumulated when the rate of formation of voids increases, an effective area of contact between the conductive joint portion and the semiconductor chip is caused to decrease, and the thermal conductivity via the conductive joint portion per apparent joint area decreases. Likewise, if voids formed at the interface are accumulated, detachment occurs at the interface between the conductive joint portion and the semiconductor chip. As the temperature cycle is repeated, a stress is repeatedly applied to the conductive joint portion due to a difference in heat expansion coefficient between the semiconductor chip and the lead frame, whereby in an area where voids formed at the interface are accumulated, expansion of detachment to its periphery proceeds. As a result, the effective area of contact between the conductive joint portion and the semiconductor chip further decreases, and the rate of change in thermal conductivity in the temperature cycle test increases. The ratio of the spherical metal powder to the flaky metal powder is preferably selected in the range of 100:0 to 50:50 in avoiding an increase in rate of formation of voids and occurrence of detachment resulting from the phenomenon in which as the blending ratio of the flaky metal powder increases, the flowability of the pasty composition itself noticeably decreases when the main curing treatment is carried out after the solvent is volatilized by the preliminary curing treatment.

INDUSTRIAL APPLICABILITY

If a conductive adhesive agent according to the present invention is used to perform conductive jointing in, for example, a step of die-mounting a semiconductor chip on a lead frame, a thermosetting resin for uses as a binder resin is cured after a solvent blended for adjustment of a fluid viscosity is volatilized by low-temperature heating in advance, and therefore there is an advantage that the amount of "gaseous or volatile secondary reaction products" gasified and dissipated among secondary reaction products produced by secondary reactions when a heating treatment is carried out at a temperature of 200° C. or higher is small, and thus formation of voids and detachment at the interface resulting from accumulation of the "gaseous or volatile secondary reaction products" on the interface of a joint portion are reduced. With the advantage that formation of voids and detachment at the interface are inhibited, a joint portion excellent in thermal conductivity can be obtained when the conductive adhesive agent is applied to the step of die-mounting the semiconductor chip on the lead frame. In addition, by ensuring that voids and detachment at the interface do not occur in the conductive joint portion produced, for example, progressive expansion of detachment at the interface during subsequent application of the temperature cycle is also prevented, and therefore long term reliability of the joint portion is improved.

The invention claimed is:

1. A conductive adhesive agent comprising, as major constituent parts, a metal component as a conductive medium and a thermosetting resin as an adhesive component,
   wherein the conductive adhesive agent contains, as essential components thereof:
   a metal powder (A) made of at least one metal material selected from the group consisting of silver, copper, gold, platinum, nickel, zinc, bismuth and tungsten, and having an average particle size selected to be in the range of 0.5 to 30 μm;
   ultrafine particles (B) that are composed of ultrafine metal particles with an average particle size selected to be in the range of 1 to 20 nm made of at least one metal material selected from the group consisting of silver, copper, gold, platinum, nickel, zinc and bismuth, and a covering layer of an organic compound being formed on the metal surface thereof;
   a thermosetting resin (C); and
   a solvent (D), and
   the ratio of blended amounts of said essential components in the conductive adhesive agent is such that provided that the blended amount A of said metal powder is 100 parts by weight,
   the blended amount B of said ultrafine particles is selected to be in the range of 1 to 10 parts by weight, the blended amount C of said thermosetting resin is selected to be in the range of 5 to 15 parts by weight, and the blended amount D of said solvent is selected to be 10 parts or less by weight wherein a mixture of spherical metal powder (A-1) and a flaky metal powder (A-2) is used as said metal powder (A), and the mixing ratio of the spherical metal powder (A-1) is selected to be in the range of 99:1 to 50:50 as a weight ratio.

2. The conductive adhesive agent according to claim 1, wherein when the conductive adhesive agent of which the amount W is 100 parts by weight is subjected to a heating treatment at a temperature set to be within the range of 150° C. to 300° C. under the atmosphere of an inert gas to volatilize said solvent and cure said thermosetting resin, the amount of reduction in total weight resulting from components dissipated into a vapor phase with said heating treatment is defined as E, the amount of said solvent to be volatilized, which is contained in the conductive adhesive agent of said amount W, is defined as $D_1$, the amount of said metal powder contained in the conductive adhesive agent of said amount W is defined as $A_1$, the amount of said ultrafine particles contained in the conductive adhesive agent of said amount W is defined as $B_1$, and the amount of said thermosetting resin contained in the conductive adhesive agent of said amount W is defined as $C_1$, and the amount $\alpha$ of reduction in weight exclusive of the amount $D_1$ of said solvent volatilized, in the amount E of reduction in total weight resulting from components dissipated into the vapor phase, is defined as equation 1: $\alpha \equiv E - D_1$, and a ratio of weight loss F(%) resulting from gas generation other than volatization of said solvent is defined as equation 2: $F \equiv \{\alpha/(A_1+B_1+C_1)\} \times 100$, the ratio of weight loss F(%) is kept within 3% by weight.

3. The conductive adhesive agent according to claim 1, wherein the organic compound composing said covering layer present on the metal surface of the ultrafine metal particles for said ultrafine particles (B) is an organic compound that is capable of reacting with any of resin constituting components of said thermosetting resin (C) to be incorporated into part of said thermosetting resin.

4. The conductive adhesive agent according to claim 1, wherein said thermosetting resin (C) is a thermosetting resin composition comprising a coupling agent, in addition to an epoxy resin and its curing agent used as resin constituting components.

5. A process for manufacturing an article comprising a conductive jointing body, and a first member and a second member bound together by the conductive jointing body, comprising the step of:

holding said first member and second member via the conductive adhesive agent according to claim 1, and heating said conductive adhesive agent to obtain said conductive jointing body therebetween, whereby the binding is attained.

6. A process for manufacturing a semiconductor device, comprising the steps of:

feeding the conductive adhesive agent according to claim 1 onto a lead frame as a die-mounting agent;

mounting a semiconductor element on said die-mounting agent;

heat-curing said die-mounting agent to form a conductive joint thereby;

bonding between said semiconductor element and said lead frame by a metal wire; and sealing at least part of said lead frame, the die mounting agent, the semiconductor element and the metal wire.

7. A conductive adhesive agent comprising, as major constituent parts, a metal component as a conductive medium and a thermosetting resin as an adhesive component, wherein the conductive adhesive agent contains, as essential components thereof:

a metal powder (A) made of at least one metal material selected from the group consisting of silver, copper, gold, platinum, nickel, zinc, bismuth and tungsten, and having an average particle size selected to be in the range of 0.5 to 30 μm;

ultrafine particles (B) that are composed of ultrafine metal particles with an average particle size selected to be in the range of 1 to 20 nm made of at least one metal material selected from the group consisting of silver, copper, gold, platinum, nickel, zinc and bismuth, and a covering layer of an organic compound being formed on the metal surface thereof;

a thermosetting resin (C); and a solvent (D), and the ratio of blended amounts of said essential components in the conductive adhesive agent is such that the blended amount A of the metal powder is selected to be in the range of 74.0 parts by weight to 94.3 parts by weight, the blended amount B of said ultrafine particles is selected to be in the range of 0.9 parts by weight to 8.7 parts by weight, the blended amount C of said thermosetting resin is selected to be in the range of 4.0 parts by weight to 12.9 parts by weight, and the blended amount D of said solvent is selected to be within 8.6 parts by weight wherein a mixture of spherical metal powder (A-1) and a flaky metal powder (A-2) is used as said metal powder (A), and the mixing ratio of the spherical metal powder (A-1) is selected to be in the range of 99:1 to 50:50 as a weight ratio.

8. The conductive adhesive agent according to claim 7, wherein when the conductive adhesive agent of which the amount W is 100 parts by weight is subjected to a heating treatment at a temperature set to be within the range of 150° C. to 300° C. under the atmosphere of an inert gas to volatilize said solvent and cure said thermosetting resin, the amount of reduction in total weight resulting from components dissipated into a vapor phase with said heating treatment is defined as E, the amount of said solvent to be volatilized, which is contained in the conductive adhesive agent of said amount W, is defined as $D_1$, the amount of said metal powder contained in the conductive adhesive agent of said amount W is defined as $A_1$, the amount of said ultrafine particles contained in the conductive adhesive agent of said amount W is defined as $B_1$, and the amount of said thermosetting resin contained in the conductive adhesive agent of said amount W is defined as $C_1$, and the amount $\alpha$ of reduction in weight exclusive of the amount $D_1$ of said solvent volatilized, in the amount E of reduction in total weight resulting from components dissipated into the vapor phase, is defined as equation 1: $\alpha \equiv E-D_1$, and a ratio of weight loss F(%) resulting from gas generation other than volatization of said solvent is defined as equation 2: $F \equiv \{\alpha/(A_1+B_1+C_1)\} \times 100$, the ratio of weight loss F(%) is kept within 3% by weight.

9. The conductive adhesive agent according to claim 7, wherein the organic compound composing said covering layer present on the metal surface of the ultrafine metal particles for said ultrafine particles (B) is an organic compound that is capable of reacting with any of resin constituting components of said thermosetting resin (C) to be incorporated into part of said thermosetting resin.

10. The conductive adhesive agent according to claim 7, wherein said thermosetting resin (C) is a thermosetting resin composition comprising a coupling agent, in addition to an epoxy resin and its curing agent used as resin constituting components.

\* \* \* \* \*